(12) United States Patent
Morita

(10) Patent No.: US 7,153,728 B2
(45) Date of Patent: Dec. 26, 2006

(54) ESTIMATION OF REMAINING FILM THICKNESS DISTRIBUTION, CORRECTION OF PATTERNING AND INSULATION FILM REMOVING MASKS WITH REMAINING FILM THICKNESS DISTRIBUTION, AND PRODUCTION OF SEMICONDUCTOR DEVICE WITH CORRECTED PATTERNING AND INSULATION FILM REMOVING MASKS

(75) Inventor: Takeshi Morita, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 88 days.

(21) Appl. No.: 10/732,343

(22) Filed: Dec. 11, 2003

(65) Prior Publication Data

US 2004/0121613 A1 Jun. 24, 2004

(30) Foreign Application Priority Data

Dec. 13, 2002 (JP) ............................. 2002-362864

(51) Int. Cl.
*H01L 21/82* (2006.01)
(52) U.S. Cl. .................. 438/129; 438/424; 430/30; 430/311
(58) Field of Classification Search ............... None
See application file for complete search history.

(56) References Cited

U.S. PATENT DOCUMENTS

| | | | | |
|---|---|---|---|---|
| 5,641,704 A | * | 6/1997 | Paoli et al. ............... | 438/436 |
| 5,998,279 A | * | 12/1999 | Liaw .......................... | 438/424 |
| 6,265,120 B1 | * | 7/2001 | Huang ......................... | 430/30 |
| 6,281,049 B1 | * | 8/2001 | Lee ............................. | 438/129 |
| 6,503,667 B1 | * | 1/2003 | Kobayashi ..................... | 430/5 |
| 6,787,459 B1 | * | 9/2004 | Moniwa et al. ............ | 438/671 |
| 2002/0078430 A1 | * | 6/2002 | Miyazaki ...................... | 716/21 |
| 2002/0150824 A1 | * | 10/2002 | Park ............................ | 430/5 |
| 2003/0044721 A1 | * | 3/2003 | Hotta et al. ................ | 430/311 |
| 2003/0152873 A1 | * | 8/2003 | Tainaka et al. ............ | 430/313 |

FOREIGN PATENT DOCUMENTS

JP 2000-349145 2/2000

* cited by examiner

*Primary Examiner*—Duy-Vu N Deo
(74) *Attorney, Agent, or Firm*—Takeuchi&Kubotera, LLP

(57) ABSTRACT

By making use of the remaining film thickness distribution (CMP pattern ratio) that is a distribution of estimates of the remaining film thickness after the CMP process, the first region A is abstracted from the patterning mask that corresponds to the region X where values of the remaining film thickness distribution is higher than the first threshold. Correction of the layout of the first dummy mask pattern (40a) is designed for forming the first dummy active region having a width no less than a predetermined width on the semiconductor outside the active region forming mask pattern (16) within the region A. In accompany with this patterning mask correction, correction of the insulation film removing mask pattern (40a') is designed in the first region A' of the insulation film removing mask so as to removed a predetermined area of the insulation film formed on the first dummy active region. Based on these designs, actual patterning and insulation film removing masks are formed.

8 Claims, 21 Drawing Sheets

C 1 (40%~50%)

ESTIMATION OF REMAINING FILM THICKNESS DISTRIBUTION, CORRECTION OF PATTERNING AND INSULATION FILM REMOVING MASKS WITH REMAINING FILM THICKNESS DISTRIBUTION, AND PRODUCTION OF SEMICONDUCTOR DEVICE WITH CORRECTED PATTERNING AND INSULATION FILM REMOVING MASKS

BACKGROUND OF THE INVENTION

1. Field of the Invention

The present invention relates to a process for making a semiconductor device and, more particularly, to a method of estimating the remaining film thickness distribution for use in correction of a mask for the production of a semiconductor device, a method of correcting the mask with this estimation method, and a process for making a semiconductor device with the corrected mask.

2. Description of the Related Art

As the degree of integration of semiconductor devices increases, an increasing number of technologies are used to isolate adjacent semiconductor devices by insulation. Among them, the trench isolation method by which adjacent semiconductor devices are isolated by the insulation film embedded in a trench makes it possible to reduce the isolation width so much that it is useful for large-scale integration. This trench isolation method includes a shallow trench isolation (STI)-chemical mechanical polishing (CMP) process.

In the STI-CMP process, a trench is formed by etching a surface protective film and a semiconductor substrate with a patterning mask that has a mask pattern for forming an active region between device isolation trenches. Then, an insulation film is formed to fill the trench and cover the active region. This insulation film is formed by a high density plasma (HDP)-chemical vapor deposition (CVD) process. After the HDP-CVD process, a predetermined area of the insulation film is removed by etching with an insulation film removing mask that has a mask pattern for removing the insulation film. The predetermined area is a portion of the active region having a short side that has a predetermined length such as 2.4 um or more. Then, CMP is made onto the insulation film to expose the surface protection film, thereby forming a device isolation section that the insulation film is filled in the device isolation trench. See Japanese patent application Kokai No. 2000-349145.

However, the above STI-CMP process sometimes makes both an active coarse region where the active region exists sparsely and an active dense region where the density of active region is high. In the mixed presence of the active coarse and dense regions, the thickness of surface protection films remained after the CMP process on the active regions is different between the active coarse and dense regions. This difference is called "global step difference." The global step difference is made by elastic deformation of a polishing pad, which is in contact with the insulation film through slurry, resulting from the coarse/dense condition of the active region in the CMP process.

More specifically, the surface of an insulation film in the active coarse region is so flat that the polishing pressure of the polishing pad on the insulation film is substantially even. On the other hand, the surface of an insulation film in the active dense region is so uneven that the polishing pressure of the polishing pad on the insulation film is dispersed. As a result, the polishing rate (speed) in the active dense region is lower than that of the active coarse region, resulting in the uneven film thickness between the active coarse and dense regions or causing a global step difference. In the case of a large global step difference, at the end of the CMP process, the active coarse region is ground but the insulation film remains on the active dense region. This lowers the reliability or yield of the resultant semiconductor device.

The inventors have discovered that the problem is solved by estimating the thickness distribution of the protection film remained on the active region and correcting the mask with the estimated thickness distribution. The thickness distribution is a distribution of estimated thickness of the remaining film between the active coarse and dense regions after the CMP process.

SUMMARY OF THE INVENTION

Accordingly, it is an object of the invention to provide a method of estimating the thickness distribution of a remaining film for correcting a patterning mask and an insulation film removing mask.

It is another object of the invention to provide a method of correcting a patterning mask and an insulation film removing mask by using the remaining film thickness distribution.

It is still another object of the invention to provide a process for making a semiconductor device by using the corrected patterning and insulation film removing masks.

According to an aspect of the invention there is provided a method of correcting patterning and insulation film removing masks. The method includes the steps of etching a semiconductor substrate and a surface protective film by means of a patterning mask having an active region forming pattern to form an isolation trench, thereby providing an active region having a predetermined width between the isolation trench, providing an insulation film in the isolation trench and on the active region, etching a predetermined area of the insulation film on the active region with an insulation film removing mask having an insulation film removing mask pattern, polishing the insulation film so as to expose the surface protective film, thereby providing an isolation section that the insulation film is filled in the isolation trench.

The patterning and insulation film removing masks are corrected by making use of a remaining film thickness distribution that is a distribution of estimates of remaining film thickness of the surface protective film after the polishing (also this is called "CMP pattern ratio distribution).

In order to correct the patterning mask, the remaining film thickness distribution is estimated for the mask to be used. Then, the first area is abstracted from the patterning mask that corresponds to an area where the estimates of the remaining film thickness are higher than a first threshold. Then, the first dummy mask pattern is provided on the first area outside the active region forming mask pattern for forming a first dummy active region having a width no less than the predetermined width on the semiconductor substrate within the first region.

In order to correct the insulation film removing mask in accompany with correction of the patterning mask, an insulation film removing mask pattern is provided to remove a predetermined area of the insulation film formed on the first dummy active region.

The patterning mask and the insulation film removing mask are corrected on the basis of the design of mask pattern or remaining film thickness distribution. In the case of the patterning mask, the mask is corrected so as to form the first dummy mask pattern in the first region of the patterning mask.

In the case of the insulation film removing mask, the mask is corrected so as to remove a predetermined area of the insulation film on the first dummy active region that is formed on the semiconductor substrate with the corrected patterning mask.

By performing the STI-CMP process with,the corrected patterning and insulation film removing masks, it is possible to increase the polishing rate in the CMP process of an area where estimates of the remaining film thickness are high. As a result, the unevenness of polishing rate is improved, thus suppressing the global step difference.

DESCRIPTION OF THE PREFERRED EMBODIMENTS

In FIGS. 1–24, the shapes, dimensions, and spatial relationships of components are explanatory only and the invention is not restricted to the illustrated embodiments. The preferred materials and conditions are described in the embodiments, but the materials and conditions are not limited thereto.

Figure 24:
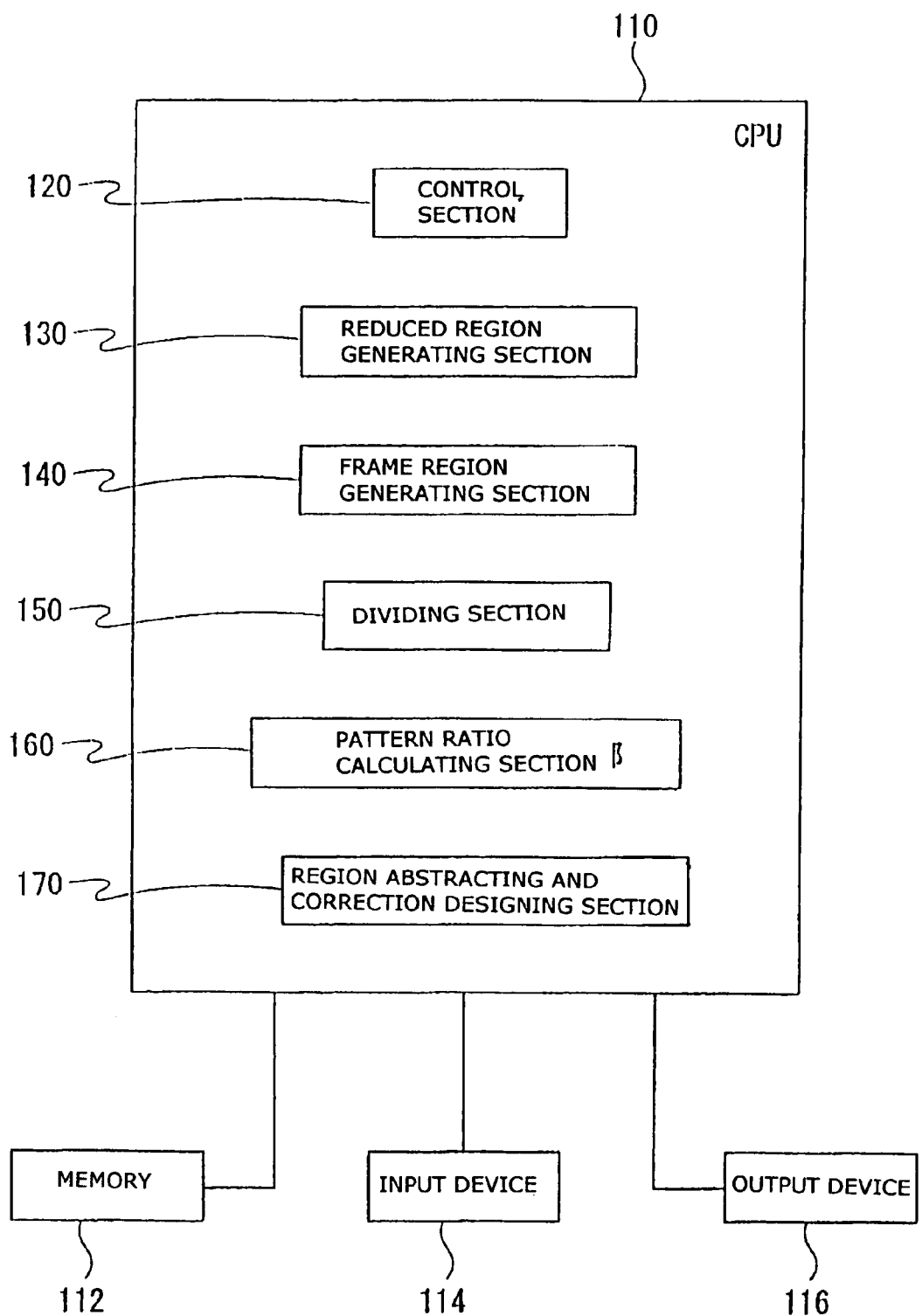
FIG. 24 is a block diagram useful for explanation of the first and second estimating methods.

According to the invention, a program is processed by a computer. FIG. 24 shows a typical computer comprising a central processing unit (CPU) 110, a memory 112, such as RAM or ROM, an input device 114, such as keyboard, mouse, or touch panel, and an output device 116 such as audio or video-display device, or printer. The CPU 110 performs a variety of functions by processing a program with software. The CPU 110 includes a control section 120, a reduced region generating section 130, a frame,region generating section 140, a dividing process section 150, a pattern ratio computing section 160, and a region abstracting and correction designing section 170.

The control section 120 receives an instruction from the input device 114 or generated within the CPU 110 and controls execution of process in the predetermined functional device, writing and/or reading information or data from the memory 112, output of a signal to the output device 116 for display or to outside, and timing of each component. This is well known and the detailed description will be omitted.

The memory 112 reads out and stores the initial information or data necessary for the process of the invention and reads and writes the information or data produced in each process.

The input device 114 stores the initial information or data in the memory 112 and inputs the necessary instruction during the process.

The other functional unit sections in the CPU 110 will be described later.

Prior to the description of embodiments, methods of estimating the thickness distribution of remaining film (CMP pattern ration distribution) that is a distribution of estimated thickness of remaining film (CMP pattern ration) and is used for correcting patterning and insulation film removing masks will be described below. The following methods are preferred but the invention is not limited thereto.

Estimation of Remaining Film Thickness Distribution 1-1. First Method of Estimating Remaining Film Thickness Distribution (CMP Pattern Ratio)

The first method will be described with reference to FIGS. 1–6 and 24. This method is made by using the above-mentioned computer. A process for making a semiconductor device including the STI-CMP process that produces a remaining film will be described with reference to FIGS. 2(A)–(E). In general, a large number of one-chip mask regions that are identical with each other in size and shape are arranged in matrix on the following patterning and insulation film removing masks. In addition, the mask pattern for forming an active region in each one-chip mask region and the mask pattern for removing the insulation film are provided in the same layout. Consequently, only a single one-chip mask region and each mask pattern in the region will be described below.

Figure 2A:
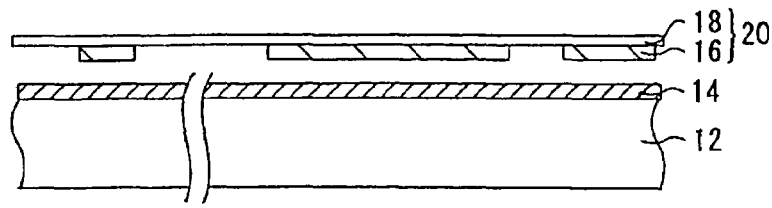
FIGS. 2(A)–(E) are sectional views of a semiconductor chip useful for explaining the first estimating method.

In FIG. 2(A), a patterning mask or photo mask 20 is opposed to a semiconductor substrate 12 that has a surface protection film 14 made of silicon nitrate (SiN) or the like. The patterning mask 20 is a positive photo mask that comprises a mask base 18 and a mask pattern 16 for forming a plurality of active regions.

Figure 2B:
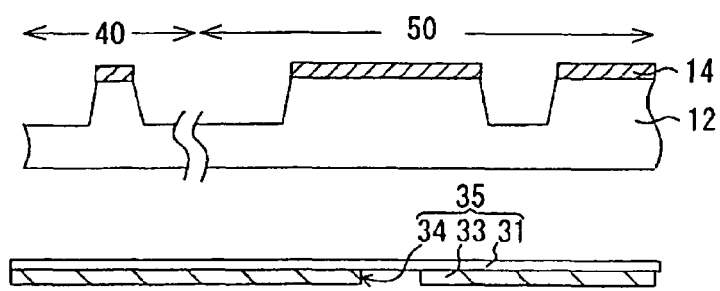
Figure 2C:
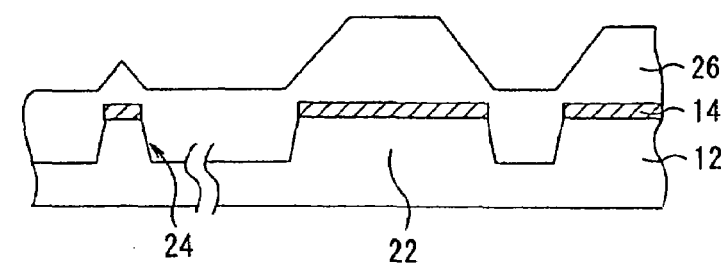
Figure 2D:
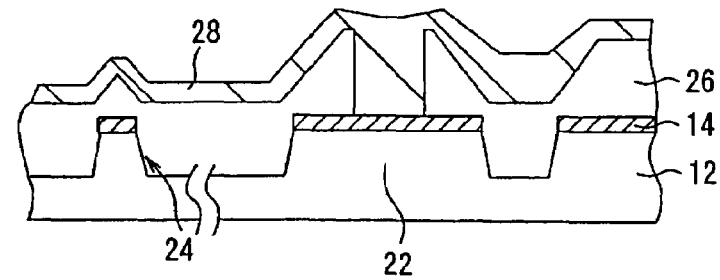

In FIG. 2(B), the semiconductor substrate 12 is etched with the patterning mask 20 to provide an isolation trench 24 and an active region 22 between the isolation trench 24 (hereinafter "STI process"). That is, the active region 22 is defined by the isolation trench 24. If the active region 22 is a rectangular having short and long sides, a rectangular region of small and large short sides is formed. The area indicated at 40 shows an active coarse region where active region exists sparsely and the area at 50 shows an active dense region where active region exists densely. The active coarse region is a region where the area occupied by the active coarse region per unit area is small while the active dense region has a large area occupied by the active region per unit area.

Then, an insulation film 26 is formed to fill the isolation trench 24 and cover the active region 22 (hereinafter "insulation film forming step"). A silicon oxide (SiO2) is used for the insulation film 26 such that the insulation film 26 on the active region 22 has a pedestal shape of which the height is dependent on the short side length of the active region 22.

Then, an insulation film removing mask or photo mask 35 is opposed to the insulation film 26. The insulation film removing mask 35 is a positive photo mask that is composed of a mask base 31 and a shield pattern 33 having a transparent pattern (blank or window pattern) 34 formed on the mask base 31.

Then, the insulation film removing mask 35 is used to etch off a predetermined area of the insulation film 26 deposited on the active region having a short side length that is greater than a predetermined length such as 2.4 um (hereinafter "insulation film removing step"). See FIG. 2(C).

The trapezoidal insulation film formed on the large active region has a top surface that is higher than the surroundings so that it affects the polishing rate. Consequently, a portion of the insulation film on the large active region is removed prior to the following CMP process to reduce the effects on the polishing rate. After the portion is removed, a slurry 28 is provided between the insulation film 26 and the polishing pad (not shown). See FIG. 2(D).

Figure 2E:
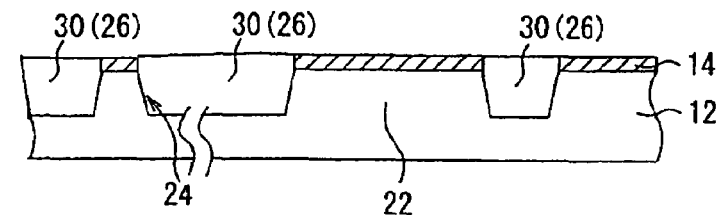

Then, as shown in FIG. 2(E), CMP is made on the insulation film 26 to form in the active coarse region 40 and the active dense region 50 an isolation section 30 that the insulation film 26 is filled in the isolation trench 24 (hereinafter "CMP step"). The CMP step is performed by rubbing the insulation film 26 with the polishing pad (not shown) via the slurry 28 under a predetermined pressure. It is ideal that the CMP is terminated when the insulation film 26 on the active region 22 is removed to expose the surface protective film 14 evenly. However, in the actual CMP step, the polishing pressure is different between the active coarse region 40 and dense region 50 so that the polishing rate in the active coarse region 40 is higher than that of the active dense region 50. Consequently, the thickness of the remaining film is uneven between the active coarse region 40 and dense region 50, causing a global step difference. Thus, it is desirable to make computer simulation to estimate the thickness difference of remaining film between the active coarse and dense regions after the CMP step based on the layout of the patterning mask.

The first method of estimating the thickness distribution of remaining film or CPM pattern ratio distribution will be described below.

Figure 1:
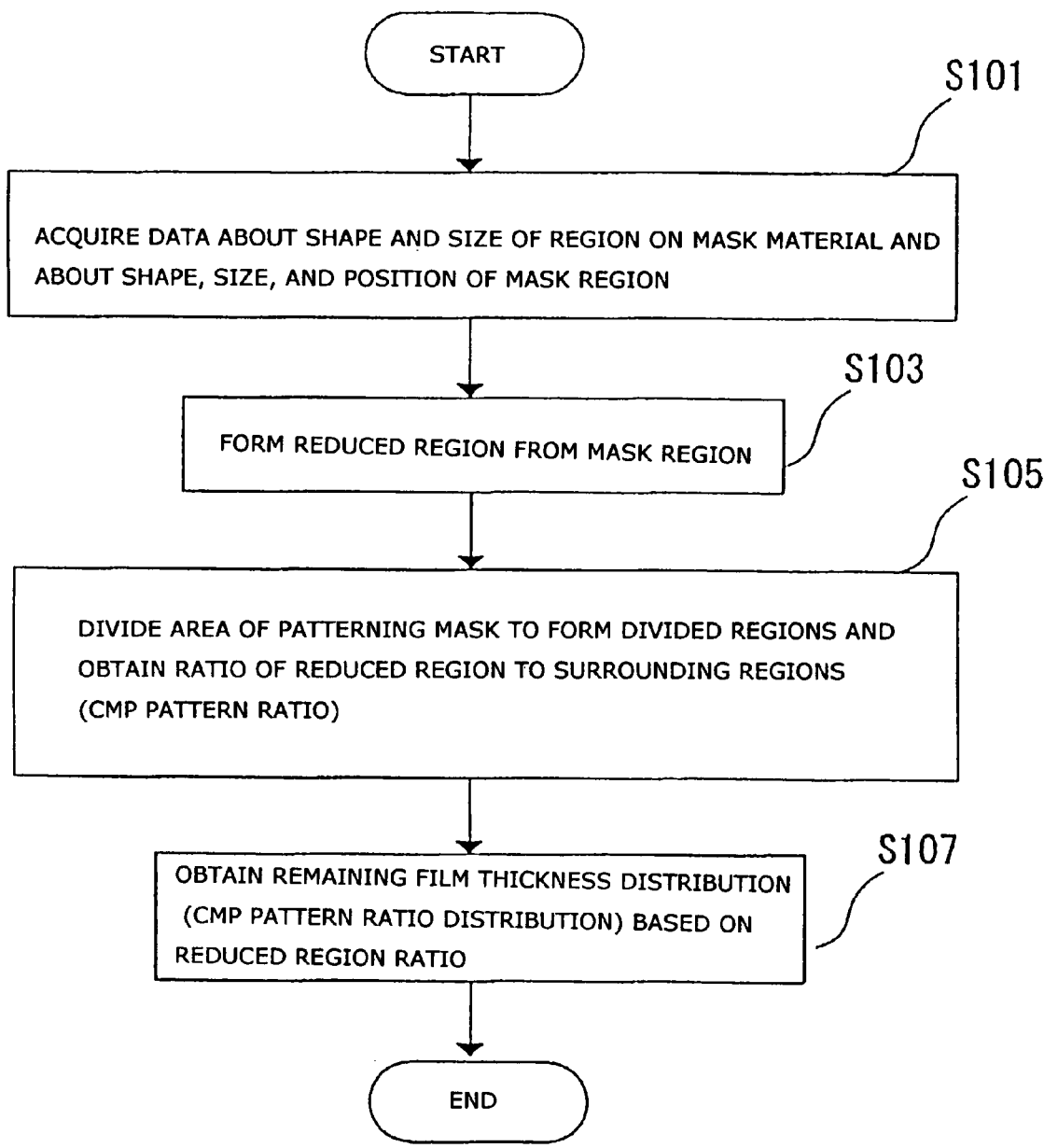
FIG. 1 is a flowchart for explaining the first method of estimating the remaining film thickness.

In Step S101 of FIG. 1, the image and numerical data for the material, shape, and size of a mask base 18 and the image and numerical data for the material, shape, size, and position of a mask pattern 16 for forming an active region, which is provided in the mask base 18, are acquired. The data is read or written onto the memory 112 via the input device 114 in FIG. 24 from the data file, such as GDS2, that is prepared by a patterning mask designing software. Based on the acquired data, a plurality of pieces of information necessary for the predetermined process is read out of the memory 112.

Figure 3:
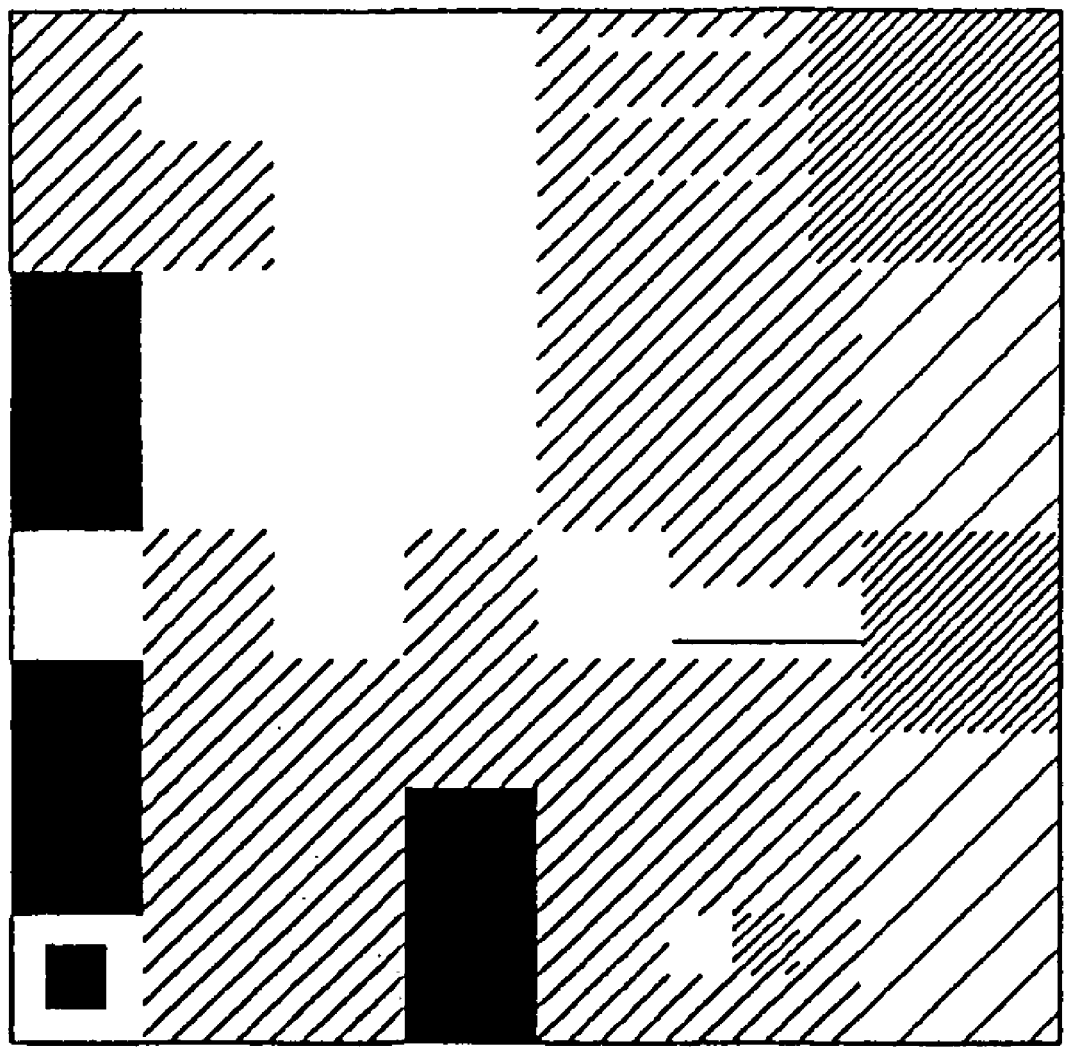
FIG. 3 is a chip diagram useful for explaining the first estimating method.

The estimation of thickness distribution of remaining film will be described where a patterning mask for forming an evaluation test element group (TEG) chip that has an active region indicated by the coarse/dense hatching in FIG. 3 is used to perform the STI-CMP step. The densely hatched area corresponds to the area having the active region forming mask pattern at high density. The size of the evaluation TEG chip is equal to that of the one-chip semiconductor substrate or chip size. Thus, the estimation of thickness distribution of remaining film is made on the patterning mask where the active region forming mask pattern 16 is made in a matrix form such that its density is shown in FIG. 3.

Figure 4A:
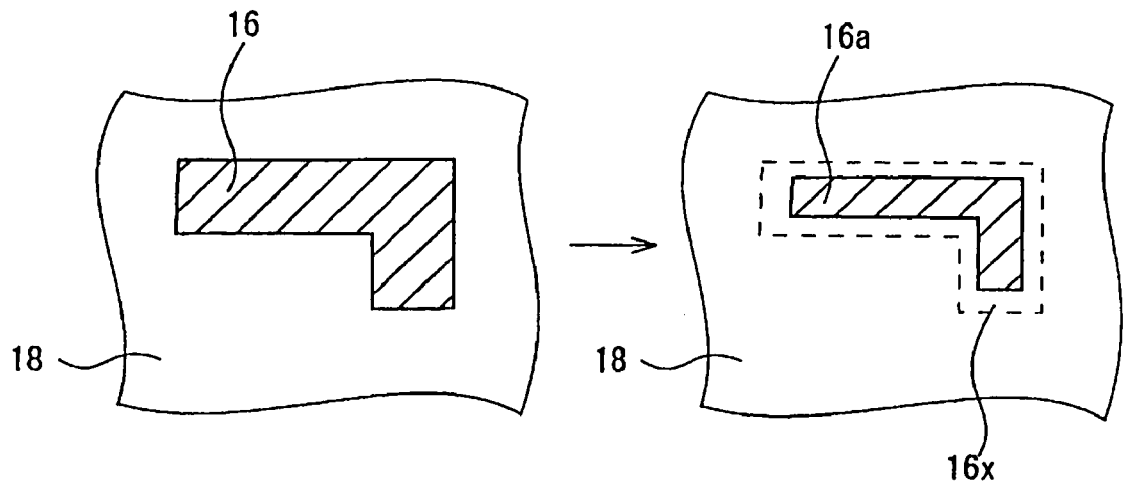
FIGS. 4(A) and (B) are chip diagrams useful for explaining the first estimating method.

Then, in step S103, an area of a predetermined width is removed along the periphery of the active region forming mask pattern to form a reduced region. This reduced region formation is made in the reduced region forming unit 130 of FIG. 24. Taking a given mask pattern provided on the patterning mask 20 in the one-chip mask area as shown in FIG. 4(A) for an example, the formation of the reduced region will be described.

In general, when an insulation film is made on a semiconductor substrate having an isolation trench, it has a surface that is indented at the isolation trench. The insulation film is deposited on the active region such that it decreases in size or is minus-sized upwardly to form a trapezoidal layer where the bottom area is wider than the top area. See FIG. 2(C).

The reduced region 16a is made such that its shape and size are substantially equal to those of the top area of the insulation film on the active region. That is, the reduced region 16a is made by subtracting from the mask pattern 16 a removing area 16x that is equal to the quantity of minus-sizing, such as 0.02 um, the active region formed with the mask pattern. Consequently, the mask pattern 16 and the reduced region 16a have similar figures. The removing area 16a is determined from the material and thickness of an insulation film. For this reason, information for the material and thickness of an insulation film and information for the minus-sizing quantity corresponding to the first information are input into the computer via the input device 114 and the first and second information are correlated and stored in the memory 112. Alternatively, the removing area determined by the material and thickness of a film is stored in the memory 112 in advance. In order to form the reduced area, an instruction is input into the reduced area forming unit 130 via the input device 114 to read out the image data of the mask pattern 16 from the memory 112 to display the image on the output device 116.

When the instruction is input to the reduced region forming unit 130 from the input device 114, the size, position, and numerical information of the mask pattern 16 are read out in the reduced region forming unit 130 from the memory 112 while the minus-sizing quantity related to the mask pattern 16 is read out to make subtraction in the reduced region forming unit 130. The result is stored in the memory 112 and sent to the output device 116 for image display. It is preferred that the original mask pattern 16 and the reduced region are outlined by broken and solid lines, respectively.

Then, in step S105, estimates of the thickness of the remaining surface protective film (CMP pattern ratio) are determined. This is made mainly by the dividing unit 150 and the pattern ratio calculating unit 160. The area of the patterning mask 20 is divided into a given number of divided areas that have the same shape and size. This is made by sending an appropriate dividing instruction from the input device 114 to the division unit 150 while watching the computer display. Either central one-chip mask region and eight peripheral one-chip mask regions surrounding the central one-chip mask region or the entire region of the patterning mask is divided.

The thickness of a remaining film after the CMP process is affected by the density of the peripheral active region. Thus, the peripheral regions surrounding the central region of a unit of divided area are considered. That is, first of all, a dividing information is input into the dividing unit 150 via the input device 114. The dividing information contains information for specifying the mask region to be divided and information about the size of area into which the specified mask region is divided.

Figure 4B:
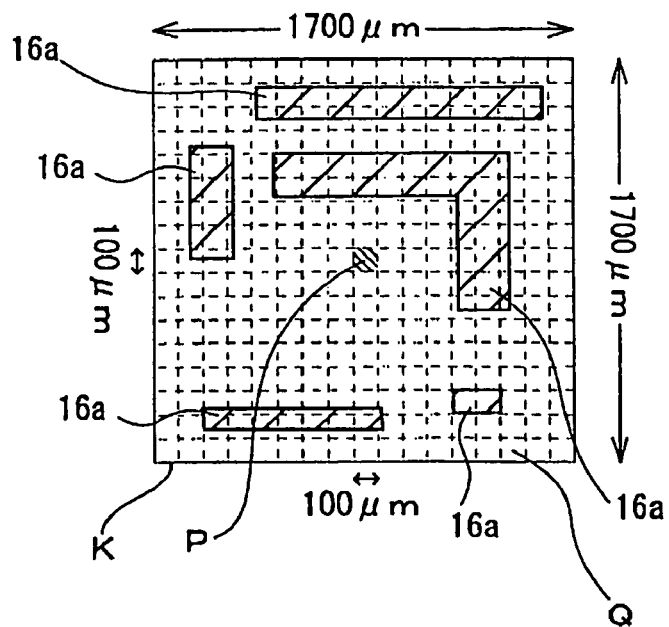

As shown in FIG. 4(B), the dividing unit 150 divides the entire area of a one-chip mask region K (square of 1700 um) into squares of 100 um. As a result, 17×17 divided areas are formed. At the same time, the coordinate position of each divided area is determined. The one-chip mask region is arranged in a matrix form so that 17×17 divided areas are made for all of the central and eight peripheral one-chip mask regions. The number of division is not limited to 17×17 but may take any appropriate number. The information about the divided regions made in the dividing unit 150 is not only stored in the memory 112 but also sent to the output device 116 for display. Then, the CMP pattern ratio for each divided area within the one-chip mask region K is determined. The pattern ratio is determined for all of 17×17 divided areas. It is determined by inputting a pattern ratio requesting instruction into the pattern ratio calculating unit 160 from the input device 114.

As shown in FIG. 4(B), P represents a certain divided area and Q the rest of the one-chip mask region. When the pattern ratio demand signal is inputted into the pattern ratio calculating unit 160, the area ratio of the reduced region 16a to the sum of the 100-um square region P and the surrounding region Q that consists of a plurality of divided areas surrounding the central region P within the 1700-um square region is calculated to provide the CMP pattern ratio. If the 100-um square region P is at the center of the one-chip mask region, the sum of the square area P and the surrounding region Q is equal to the area SM of the one-chip mask region.

Then, the total area ST0 of all reduced regions 16a corresponding to all mask patterns within the one-chip region around the square region P is determined. Then, the pattern ratio calculation unit 160 calculates the area ratio ST0/SM as the CMP pattern ratio.

Figure 5:
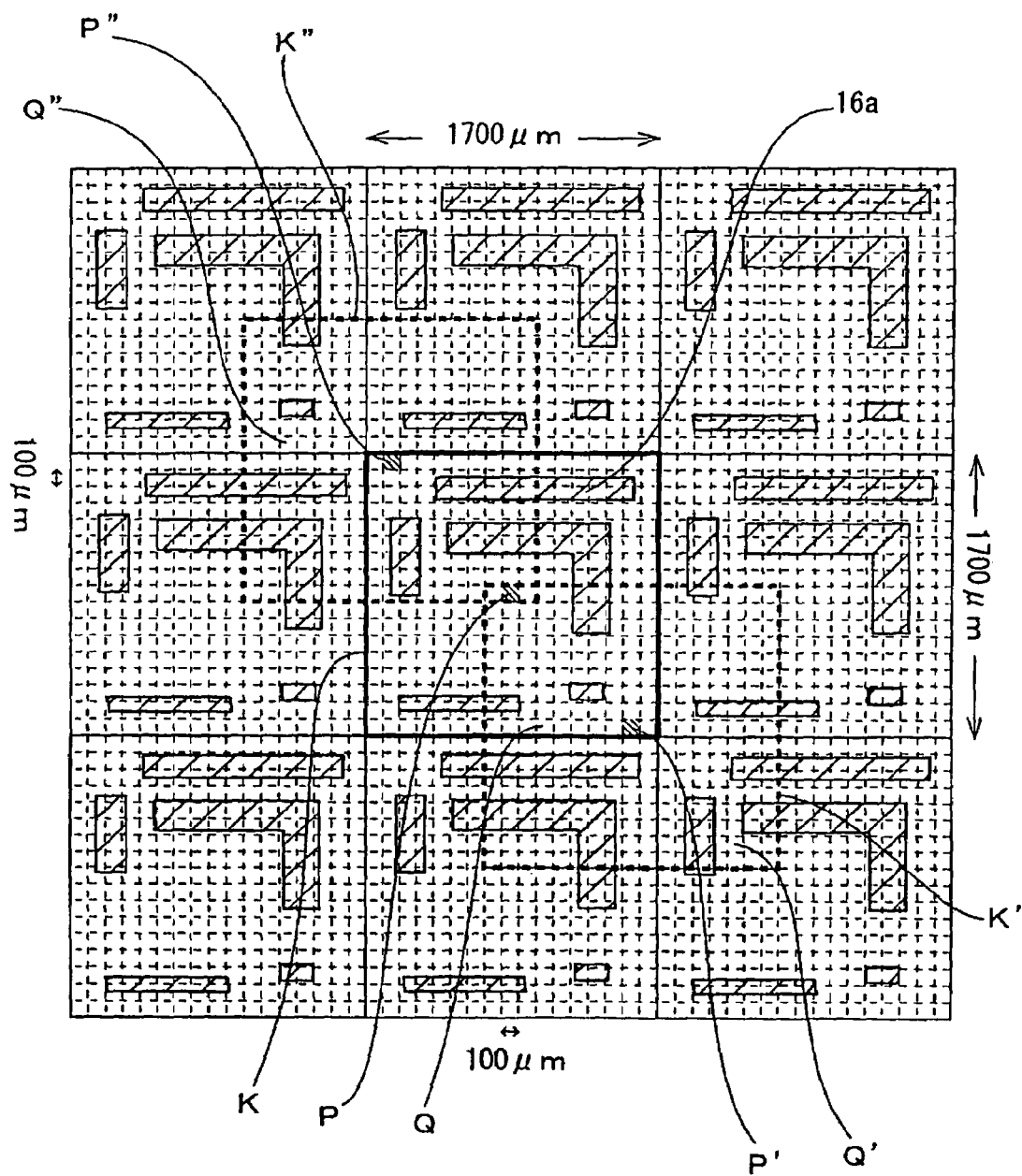
FIG. 5 is a chip diagram useful for explanation of the first estimating method.

Then, as shown in FIG. 5, it is supposed that the position of central square region P is shifted to the position of central square region P'. The information for specifying the mask region to be divided and the reduced region is inputted. Based on the dividing information including such specifying information, the one-chip mask region surrounding the specified one-chip mask region is divided and stored in the memory 112 and sent to the output device 116 for display as image information. In response to the end of the dividing process, the dividing unit 150 estimates a new imaginary one-chip mask region K' (indicated by bold broken line) around the shifted 100-um square region P' and not only stores information about the imaginary one-chip mask region K' in the memory 112 but also displays at the output device 116. The imaginary one-chip mask region has the same shape and size as those of the original one-chip memory region.

The dividing unit 150 determines not only the total area ST1 of all reduced regions 16a corresponding to the all mask patterns within the imaginary one-chip mask region K' but also the area SM of the one-chip mask region. Thus, the CMP pattern ratio is determined from the ratio ST1/SM. Similarly, by estimating a new imaginary one-chip mask region K" (indicated by bold broken line) around the 100-um square region P", it is possible to determine the total area ST2 of reduced regions 16a within the region and thus the CMP pattern ratio from the ratio ST2/SM.

In this way, the CMP pattern ratio or the area ratio of reduced regions corresponding to mask patterns within the imaginary one-chip mask region around each unit is determined for all units or all reduced regions with the one-chip mask region. Each area SM, ST0, ST1, and ST2, and the pattern ratio ST0/SM, ST1/SM, and ST2/SM are related to the coordinate of each reduced region and not only stored in the memory 112 but also sent to the output device 116. In the above example, the specified reduced region is placed at the center of the one-chip mask region, but it is not limited to the central position and may be at a position shifted from the center of the imaginary one-chip mask region as long as it is a constant position for all one-chip mask regions.

Then, in step S107, the pattern ratio calculating unit 160 determines, based on the pattern ratio or the area ratio of reduced regions obtained in step S105, the thickness distribution [%] of remaining film after the CMP process (also, CMP pattern ratio distribution). A pattern ratio distribution generating instruction is inputted from the input device 114 to the pattern ratio calculating unit 160 to read the positional coordinate of each reduced region and the pattern ratio relating to the reduced region from the memory 112 and send it to the output device 116. The CMP pattern ratio distribution is either displayed on the computer or printed out on a sheet of paper. Alternatively, it is stored in the memory 112.

Figure 6:
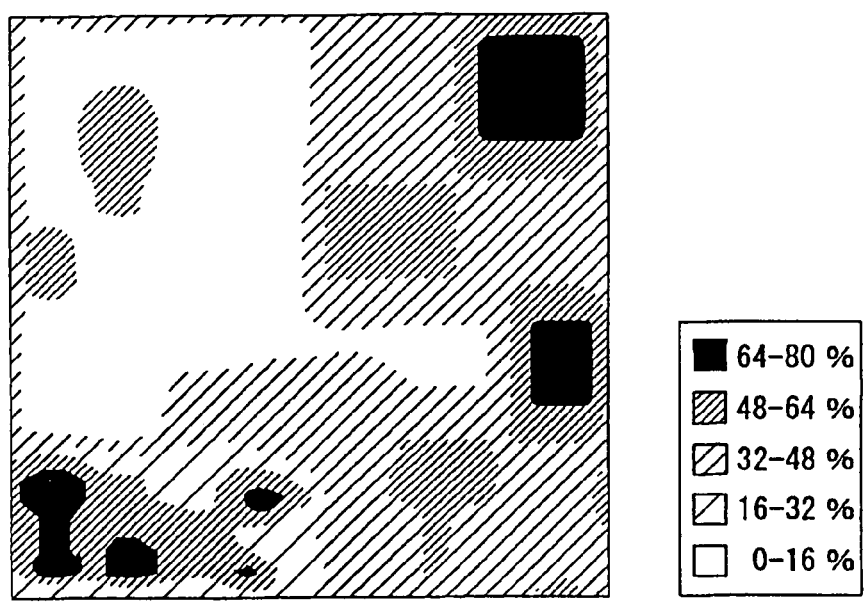
FIG. 6 is a chip diagram useful for explanation of the first estimating method.

Through the above process, a CMP pattern ratio distribution defined by such hatching as shown in FIG. 6 is provided. In this figure, the denser the hatching, the higher the CMP pattern ratio; i.e., where the remaining film is thicker. See the density [%] to the right. From the CMP pattern ratio distribution based on the patterning mask layout it is possible to estimate or simulate the thickness difference of remaining film between the active coarse and dense regions after the CMP process.

Figure 7:
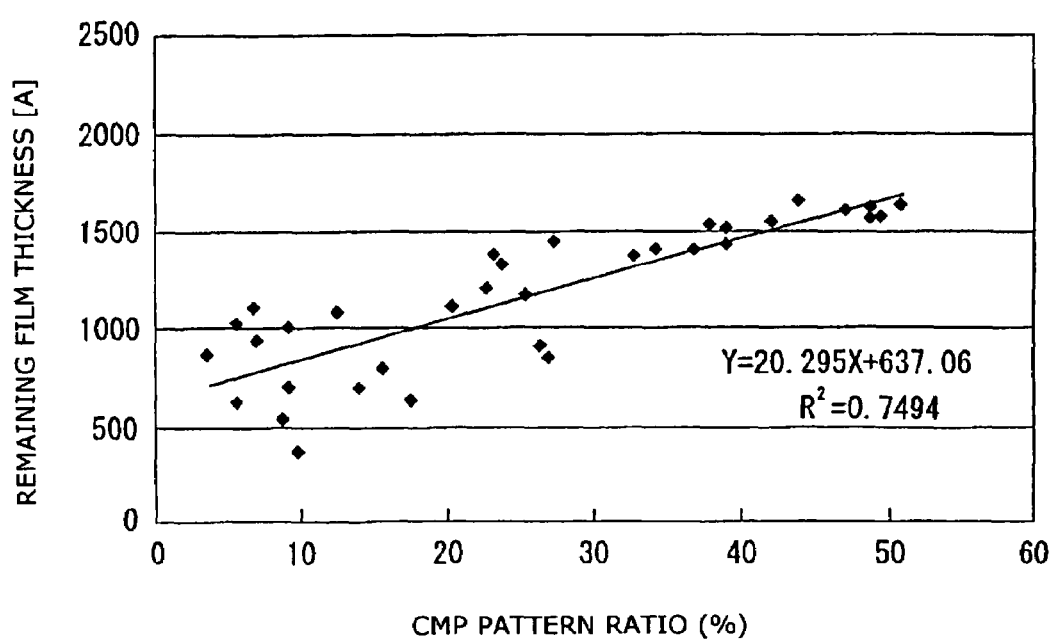
FIG. 7 is a graph useful for evaluation of the validity of the first estimating method.

1-2. Validity of the First Estimation Method of Remaining Film Thickness Distribution FIG. 7 shows the relation between the CMP pattern ratio distribution within the one-chip mask region and the thickness of the film remain after the CMP process on the active region formed with the patterning mask that provides the CMP pattern ratio distribution (remaining film thickness). The horizontal and vertical axes represent the CMP pattern ratio X [%] and the remaining film thickness Y [Å]. As shown in FIG. 7, the relation between the CMP pattern ratio and the remaining film thickness is substantially linear (correlation efficient 0.7494), indicating relatively good correlation. By using this approximate line (linear approximate equation: Y=20.295+637.06), it is possible to estimate the remaining film thickness [Å] at the CMP pattern ratio.

2-1. Second Method of Estimating Remaining Film Thickness Distribution (CMP Pattern Ratio)

The second method of estimating the remaining film thickness will be described with reference to FIGS. 8–11 and 24. This method also uses a computer. The following description is made also on one-chip mask region. This method is based on that fact that the polishing characteristics in the CMP process is different between where the insulation film 26 is left all over the active region 22 and where a portion of the insulation film 26 is removed from the active region 22 and estimates or simulates the film thickness difference between the active coarse and dense regions after the CMP process.

Figure 8:
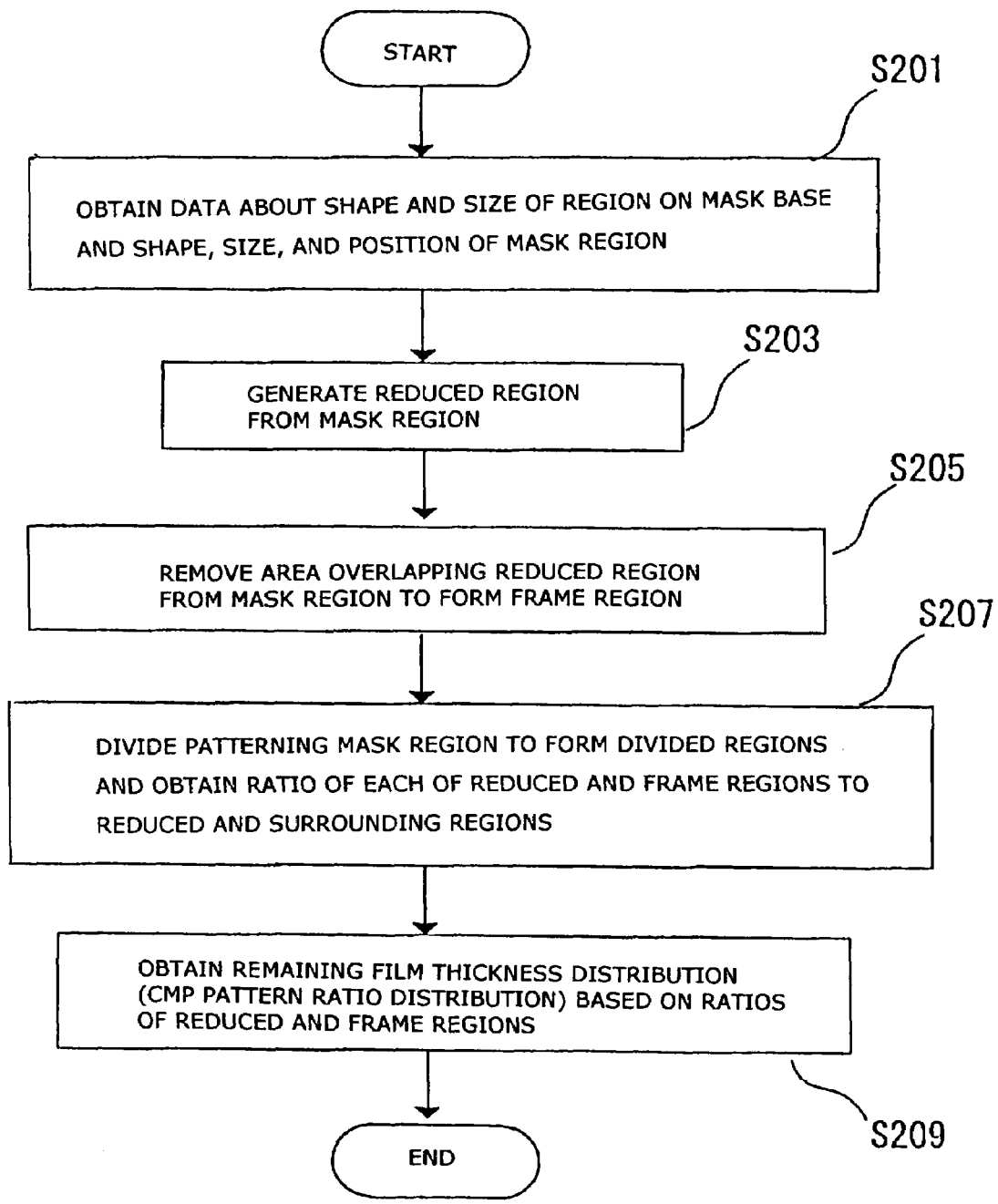
FIG. 8 is a flowchart for explaining the second method of estimating the remaining film thickness.

FIG. 8 shows the second method in flowchart wherein the layout of patterning masks and reversed mask is identical with that of the first method.

In step S201, the data about the shape and size of a region of mask material and the data about the shape, size, and position of a mask pattern to form an active region are input from the input device 114 to the memory 112. Similarly to the first method, the data are read from the data file (GDS2) that is prepared by a patterning mask designing software. Similarly to the first method, the patterning mask for forming the evaluation TEG chip having the active region defined by such hatching as in FIG. 3 is used to estimate the remaining film thickness distribution after the STI-CMP process.

Then, step S203, a reduced region is made by removing a predetermined width of peripheral portion from the active region forming mask pattern. Similar to the step S103, the process is made in the reduced region forming unit 130. In this method, however, a region equivalent to the predetermined area of the surface protective film 14 exposed on the active region 22 by the insulation removing process is made as a reduced region.

Figure 9A:
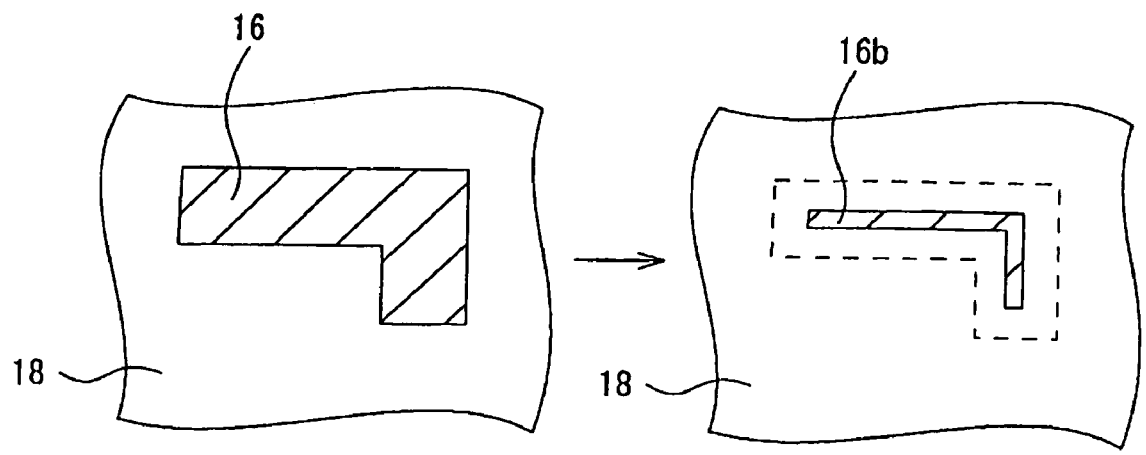
FIGS. 9(A) and (B) are chip diagrams useful for explaining the second estimating method.
Figure 9B:
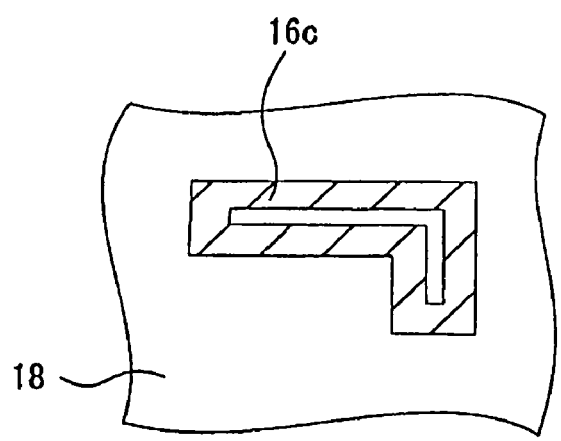

As shown in FIG. 9, a reduced region 16b is made by removing an inside edge of 1.2 um from the mask pattern 16 and then expanding the edge by 0.4 um. Also, it is possible to make a reduced region by removing only a portion of a predetermined width. Anyway, the necessary data, which has been stored in the memory 112, is read out to perform the reduced region forming process. The obtained data about reduced region is not only stored in the memory but also displayed at the output device 116.

Then, in step S205, a portion doubled with the reduced region 16b corresponding to the active region forming mask pattern 16 is removed from the active region forming mask pattern 16 to form a frame region 16c. This is made in the frame region forming unit 140 into which a frame region forming instruction is input from the input device 114. The resulting frame region 16c has an area corresponding to that of the insulation film 26 remained on the active region 22 after the insulation removing process. The information about the frame region 16c is not only stored in the memory 112 but also sent to the output device 116 for display.

Then, in step S207, similar to the step S105, the patterning mask region is divided to form a plurality of reduced regions that have the same shape and size. This is made in the dividing unit 150. The remaining film thickness after the CMP process is under the influence of the density of surrounding active region as mentioned in the first method. Thus, the surrounding region around a unit region is also considered. The area ratios of both the reduced region 16b and the frame region 16c are separately determined for all units within a one-chip mask region by the same method as in the first one at the step S105. These area ratios are determined for each of the reduced regions. The area ratio of the frame region 16c is determined in the same way as the reduced region 16b and correlated with the position coordinate information of the divided region and stored in the memory 112.

Figure 10A:
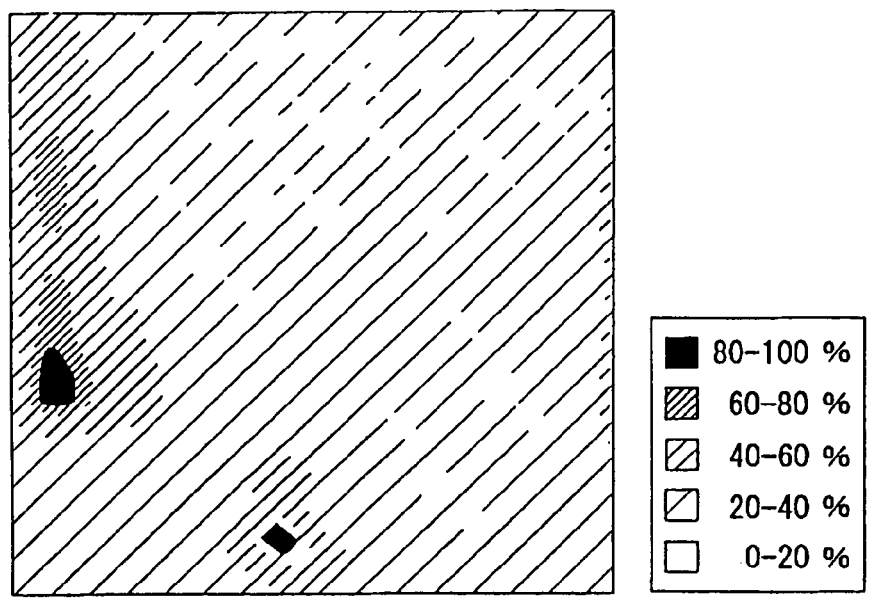
FIGS. 10(A) and (B) are chip diagrams useful for explanation of the second estimating method.
Figure 10B:
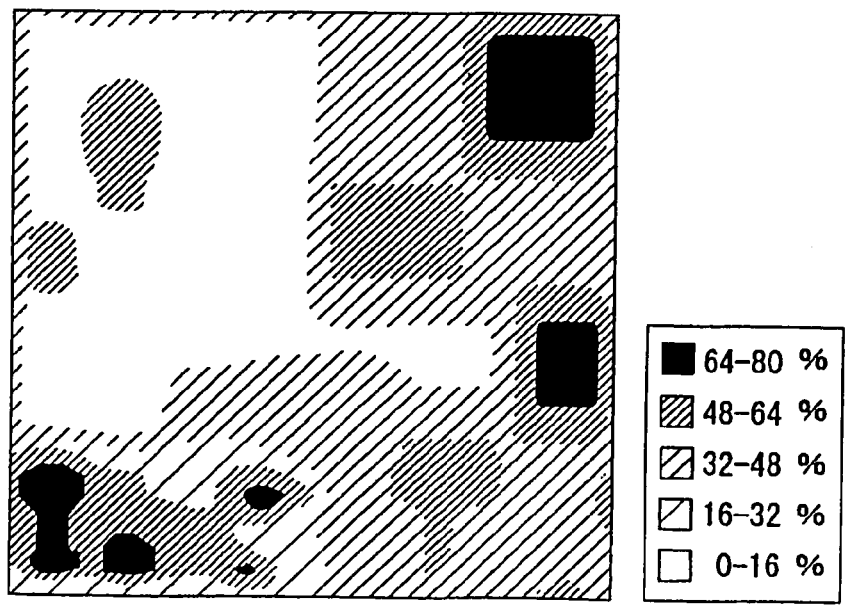

After the area ratios of both the reduced and frame regions are determined, an instruction for determining the CMP pattern ratio is inputted from the input device 114 to the pattern ratio calculating unit 160. In response to the instruction, the position data of each reduced region and the data about both the area ratios related thereto are read into the pattern ratio calculating unit 160 from the memory 112. The pattern ratio calculating unit 160 calculates the CMP pattern ratio and distribution [%] obtained from the area ratio of reduced regions as shown in FIG. 10(A) and the CMP pattern ratio and distribution [%] obtained from the area ratio of the frame region as shown in FIG. 10(B). The information about the resulting pattern ratios and distributions is not only stored in the memory 112 but also sent to the output device 116 for display.

Then, in step S209, based on the area ratios of reduced and frame regions obtained in the step S207, the remaining film thickness distribution (CMP pattern ratio distribution) [%] that enables one to estimate the remaining film thickness after the CMP process is determined. The CMP pattern ratio is calculated by combining the area ratios of reduced and frame regions such as (area ratio of reduced region)×0.25+ (area ratio of frame region). That is, the CMP pattern ratio distribution obtained by this method depends largely on the area ratio of frame region 16c determined in the step S207.

Figure 11:
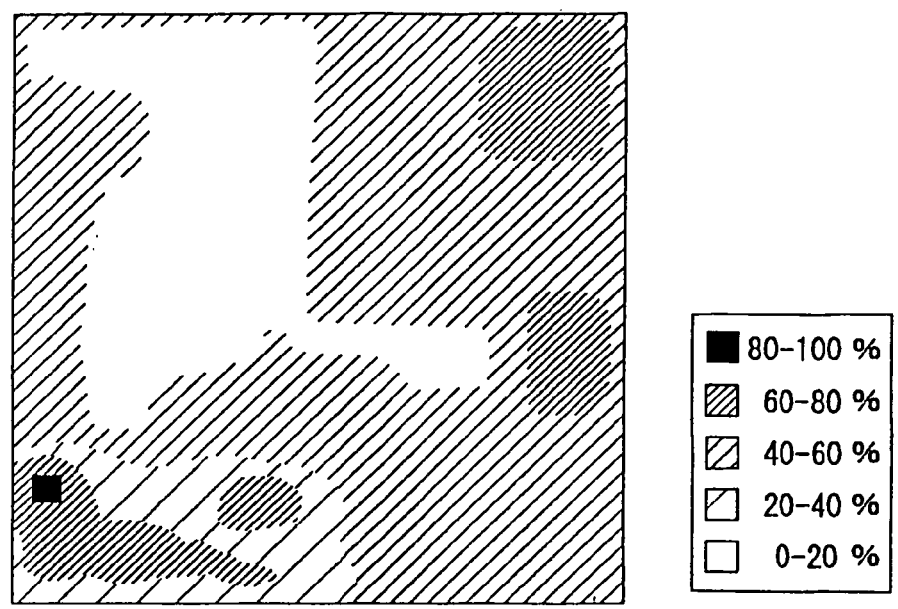
FIG. 11 is a chip diagram useful for explanation of the second estimating method.

By displaying the image or characters of the CMP pattern ratio distribution, it is possible to provide the CMP pattern ratio distribution of which the density is indicated by such hatching as shown in FIG. 11. In the figure, the denser the hatching, the higher the CMP pattern ratio (the remaining film thickness is large). See the density [%] to the right. From the CMP pattern ratio distribution obtained from the layout of a patterning mask, it is possible to estimate or simulate the remaining film thickness difference between the active coarse and dense regions after the CMP process.

Figure 12:
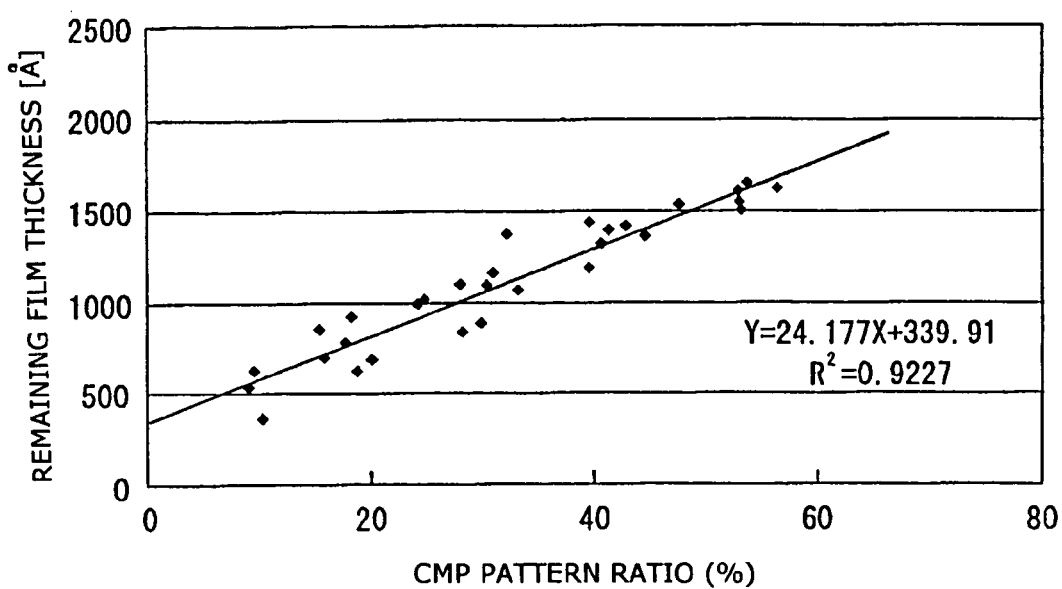
FIG. 12 is a graph useful for explanation of the validity of the second estimating method.

2-2. Validity of the Second Method of Estimating the Remaining Film Thickness Distribution FIG. 12 shows the relation between the CMP pattern ratio distribution within a one-chip mask region described in the section 2-1 and the remaining film thickness after the CMP process on the active region formed with the patterning mask that provides the CMP pattern ratio distribution. The horizontal and vertical axes are the CMP pattern ratio X [%] and the remaining film thickness Y [A], respectively. As shown in FIG. 12, the relationship between the CMP pattern ratio and the remaining film thickness is expressed by an approximate line (correlation coefficient 0.9227), which is better than that of the first method. By using the approximate line (Y=24.177X+339.91), it is possible to estimate the remaining film thickness [A] at a given CMP pattern ratio more accurately.

First Embodiment

A method of correcting the layout of a patterning mask and an insulation film removing mask by using the remaining film thickness distribution (CMP pattern ratio distribution) and a process for making a semiconductor device by using the corrected patterning and insulation film removing masks will be described with reference to FIGS. 13 and 14. The design to correct the layout of patterning and insulation film removing masks is made by using a computer. This is also called the designing of the layout correction or correction designing. The process for making a semiconductor device has been described in the section 1-1 and, therefore, the description thereof will be omitted herein. A one-chip mask region and patterning and insulation film removing masks will be described below.

Figure 13A:
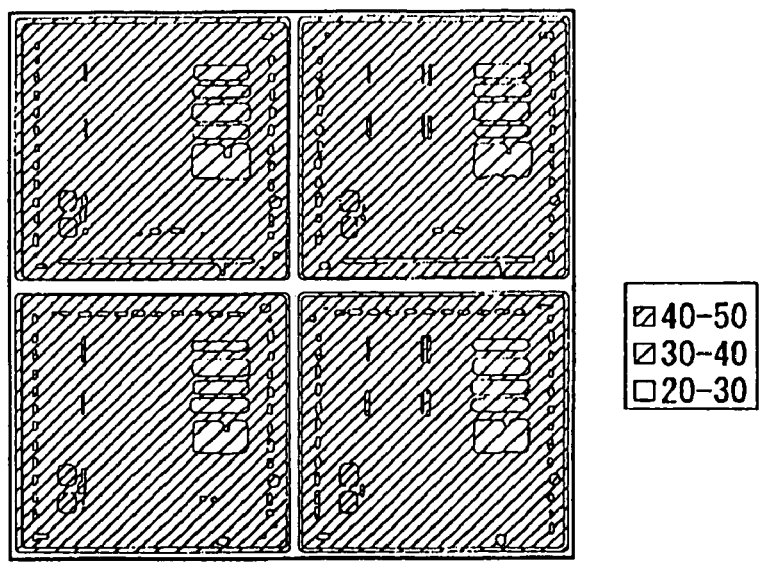
FIGS. 13(A) and (B) are chip diagrams useful for explanation of embodiments of the invention.
Figure 13B:
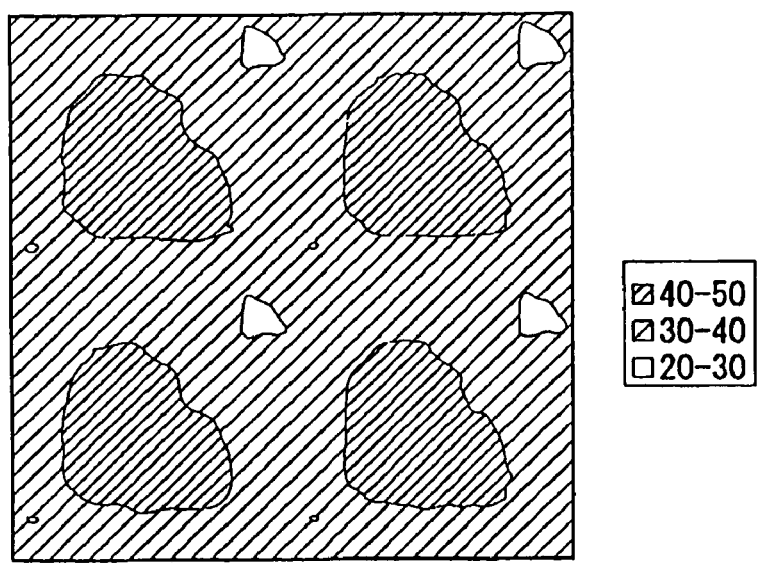
Figure 14:
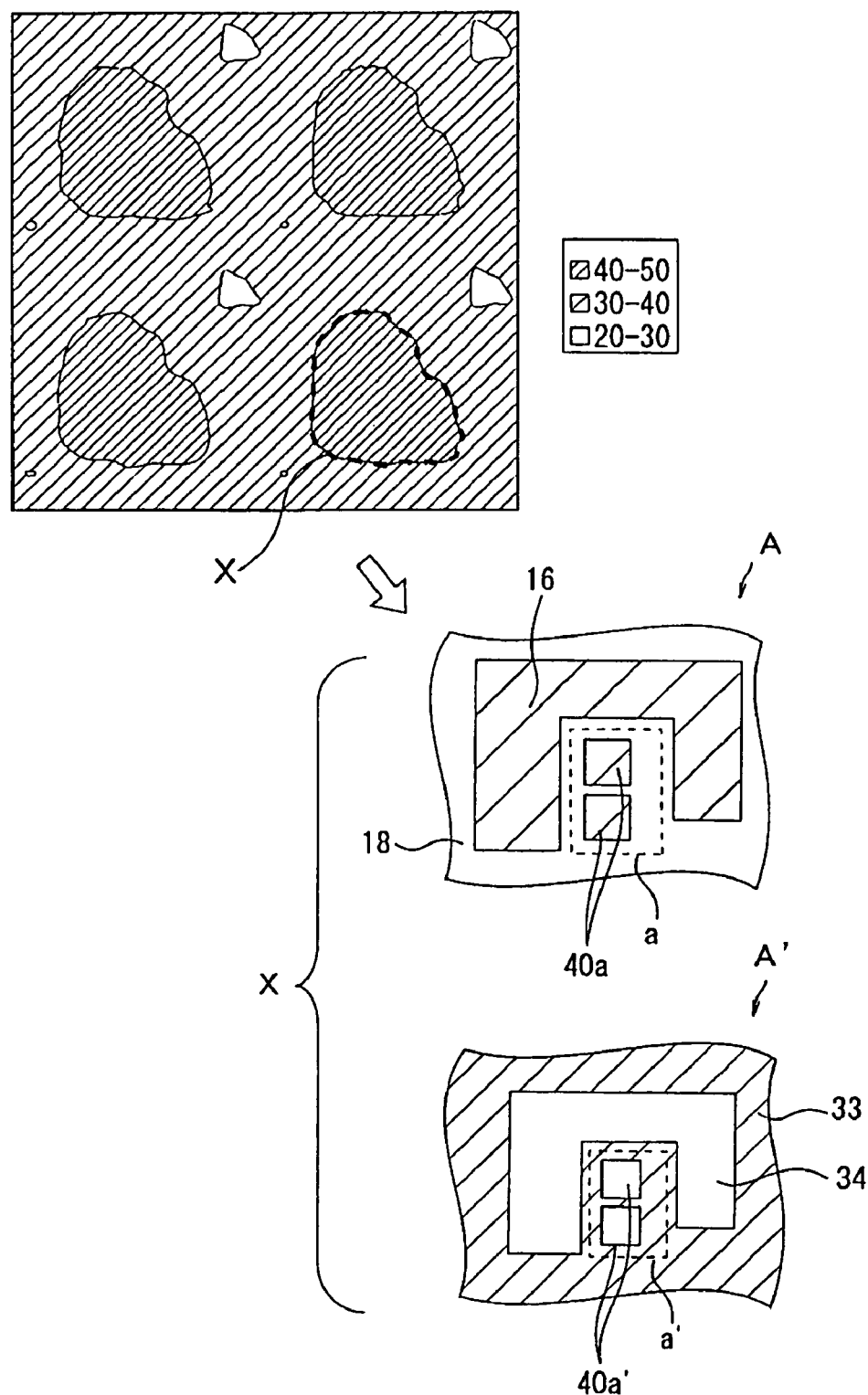
FIG. 14 is a chip diagram useful for explanation of the first embodiment of the invention.

In FIGS. 13 and 14, the CMP patter ratio distribution is obtained by the second method but may be obtained by any appropriate method of estimating the remaining film thickness distribution. FIG. 14 shows how to abstract the areas of patterning and insulation film removing masks from the CMP pattern ratio. First of all, an instruction for displaying the CMP pattern ratio distribution is input to the area abstracting and correction designing unit 170 from the input device 114. The area abstracting and correction designing unit 170 then reads out a first threshold and CMP pattern ratio from the memory 112 for comparison. Where there is an area of reduced regions of which the CMP pattern ratio is greater than the first threshold, the first region A of patterning mask corresponding to the region X where the CMP pattern ratio is greater than the first threshold (the remaining film thickness is greater than that of the area corresponding to the first threshold) based on the CMP pattern ratio distribution (FIG. 13(B)). The first threshold is a standard value to determine whether there is a mask region to be corrected in patterning masks (FIGS. 2(A)–(E) and is stored in the memory in advance as a given value designed according to the purpose and conditions. The positional information about the first region A is sent from the area abstract and correction designing unit 170 to the memory 112 and the output device 116 for display.

Then, a mask correction designing instruction is input to the area abstracting and correction designing unit 170 from the input device 114 to design correction of the patterning mask. In this embodiment, the correction designing is made by adding a new mask pattern to the patterning mask. For this reason, information about the shape and size of a first dummy mask pattern is stored in the memory 112 in advance. The shape and size of the first dummy mask pattern, which is determined according to the design, is determined to be a square. The length of a short side of the first dummy mask pattern is determined such that the length of a short side of the first dummy active region made by the first dummy mask pattern is 2.4 um or more.

The correction design is made such that the first dummy mask patterns 40a (2.4-um square) for forming the first dummy active region having a short side of a predetermined length (2.4 um or more) on the semiconductor substrate 12 are arranged at regular intervals (0.5 um) outside the mask pattern 16 within the first region A of the first dummy mask pattern. The shape and size of the first dummy mask pattern 40a are fixed regardless of the CMP pattern ratio of the region X. The data about the corrected patterning mask is not only stored in the memory 112 but also sent to the output device 116 for display.

An actual patterning mask is made based on the design of the patterning mask corrected by adding the first dummy mask pattern 40a. The first dummy active region having a width equal to or more than the required width is formed on the semiconductor substrate by performing the STI process with the actual patterning mask. The correction designing of the insulation film removing mask is also made with the correction of the patterning mask. This correction design is also made in the area abstracting and correction designing unit 170. In this embodiment, a transparent pattern 40' for removing a predetermined area of the insulation film on the first dummy active region is provided on a area a' outside the insulation film removing mask patter 34 within the first region A' of the insulation film removing mask corresponding to the region X. See FIG. 14.

An actual insulation film removing mask is corrected and formed on the basis of the design of the insulation film removing mask corrected by adding the transparent pattern 40'. The predetermined area of the insulation film on the first dummy active region is removed by performing the insulation film removing process with the corrected actual insulation film removing mask. As a result, the polishing rate on the area corresponding to the region X is increased, thereby reducing the unevenness of polishing rate on the entire chip surface in the CMP process. Consequently, the remaining film thickness on the area corresponding to the region X after the CMP process decreases (the CMP pattern ratio in the region X decreases), thus improving the flatness over the entire chip surface or the global flatness.

As described above, according to this embodiment, the mask correction designing is made such that the local polishing rate is increased according to the degree of global step difference that is estimated from the CMP pattern ratio distribution, thereby correcting the actual patterning and insulation film removing masks. By performing the STI-CMP process with the corrected patterning and insulation film removing masks, it is possible to suppress the global step difference, thus providing a reliable semiconductor device.

Second Embodiment

Figure 15:
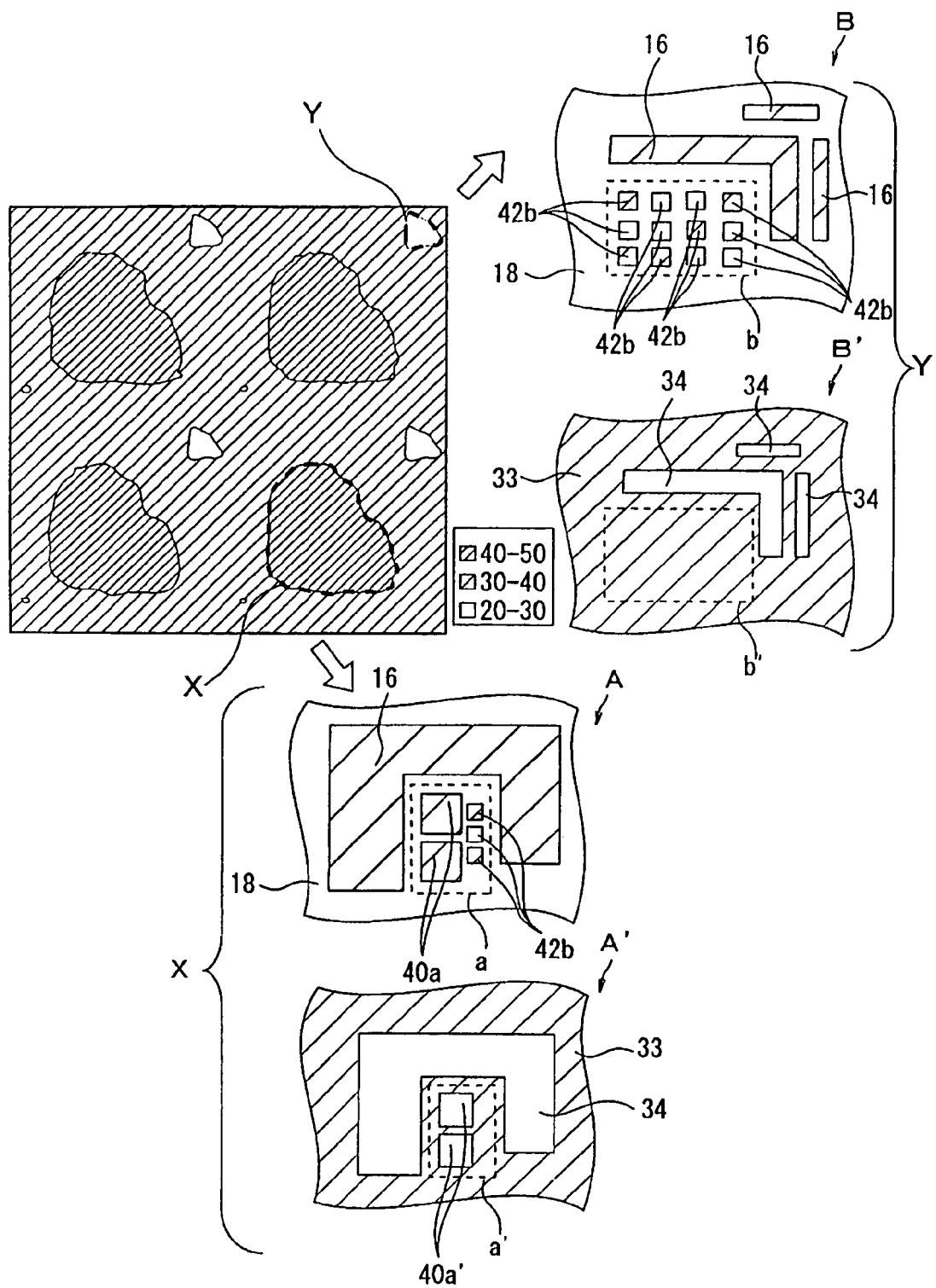
FIG. 15 is a chip diagram useful for explanation of the second embodiment of the invention.

The second embodiment will now be described with reference to FIG. 15. The second embodiment is different from the first embodiment mainly in that the correction designing of the patterning mask is made from the CMP pattern ratio distribution such that the polishing rate on an area corresponding to the region Y where the CMP pattern ratio is lower than the second threshold that is lower than the first threshold (the remaining film thickness is smaller than that of an area corresponding to the second threshold).

First of all, the second region B of the patterning mask corresponding to an area Y where the CMP pattern ratio is lower than the second threshold is abstracted on the basis of the CMP pattern ratio, distribution (FIG. 13(B)). This abstraction is made in the region abstracting and correction designing unit 170 in the same manner as the abstraction of the first region A. The second threshold is a standard value to reduce the polishing rate and lower than the first threshold. This standard value is stored in the memory 112 in advance as a given value appropriate to design that is determined according to the purpose and conditions.

Then, correction designing is made such that the second dummy mask pattern 42b (1-um square) are arranged at regular intervals (0.5 um) for forming the second dummy active region having a short side length lower than a predetermined short side length (2.4 um) on the semiconductor substrate 12. This arranging process of the second dummy mask pattern 42b on the space area b of the second region B is made in the same manner as that of the first dummy mask pattern on the space area a of the first region A.

Alternatively, the second dummy mask pattern 42b for forming the second dummy active region having a width smaller than the predetermined width on the semiconductor substrate is correction-designed also on a portion of the area a outside the first dummy mask pattern 40a. The second dummy mask pattern 42b on the space area a controls the excessive reduction in the remaining film thickness in the first region A where the first dummy mask pattern 40a is provided.

An actual patterning mask is formed by correction made on the basis of the design of patterning mask to which the second dummy mask pattern 42b is added. The second dummy active region having a width smaller than the predetermined short side width is formed on the semiconductor substrate 12 by performing the STI process with the corrected actual patterning mask.

Alternatively, the second dummy mask pattern 42b is provided only on the space area outside the mask pattern 16 in the second region B to reduce the polishing rate locally. Where the designing of patterning mask is complicated by the local provision of the second dummy mask pattern 42b, the second mask pattern 42b is provided over the entire area of a one-chip mask region. The second dummy active region has a width smaller than the predetermined short side width so that no new correction of the insulation film removing mask accompanying the patterning mask correction is made. That is, in the insulation film removing process, no insulation film removing mask pattern for removing the insulation film formed on the second dummy active region is provided on the space area b' outside the insulation film removing mask pattern or transparent pattern 34 in the second region B' of the insulation film removing mask corresponding to the region Y. See FIG. 15.

This makes the insulation film removing process leave all the insulation film on the second active region. Consequently, the polishing rate is reduced on an area corresponding to the region Y in the CMP process, and the unevenness of polishing rate is lowered over the entire chip surface. As a result, the remaining film thickness increases on the area corresponding to the region Y after the CMP process (the CMP pattern ratio increases in the region Y) but decreases in the region X (see the first embodiment) so that the flatness over the chip surface or global flatness is further improved.

As has been described above, according to the invention, the patterning and insulation film removing masks are corrected such that the polishing rate increases or decreases according to the degree of global step difference that is estimated on the basis of the CMP pattern ratio distribution. By performing the STI-CMP process with the corrected patterning and insulation film removing masks, it is possible to suppress the global step difference more than that of the first embodiment, thus providing a more reliable semiconductor device.

Third Embodiment

Figure 16:
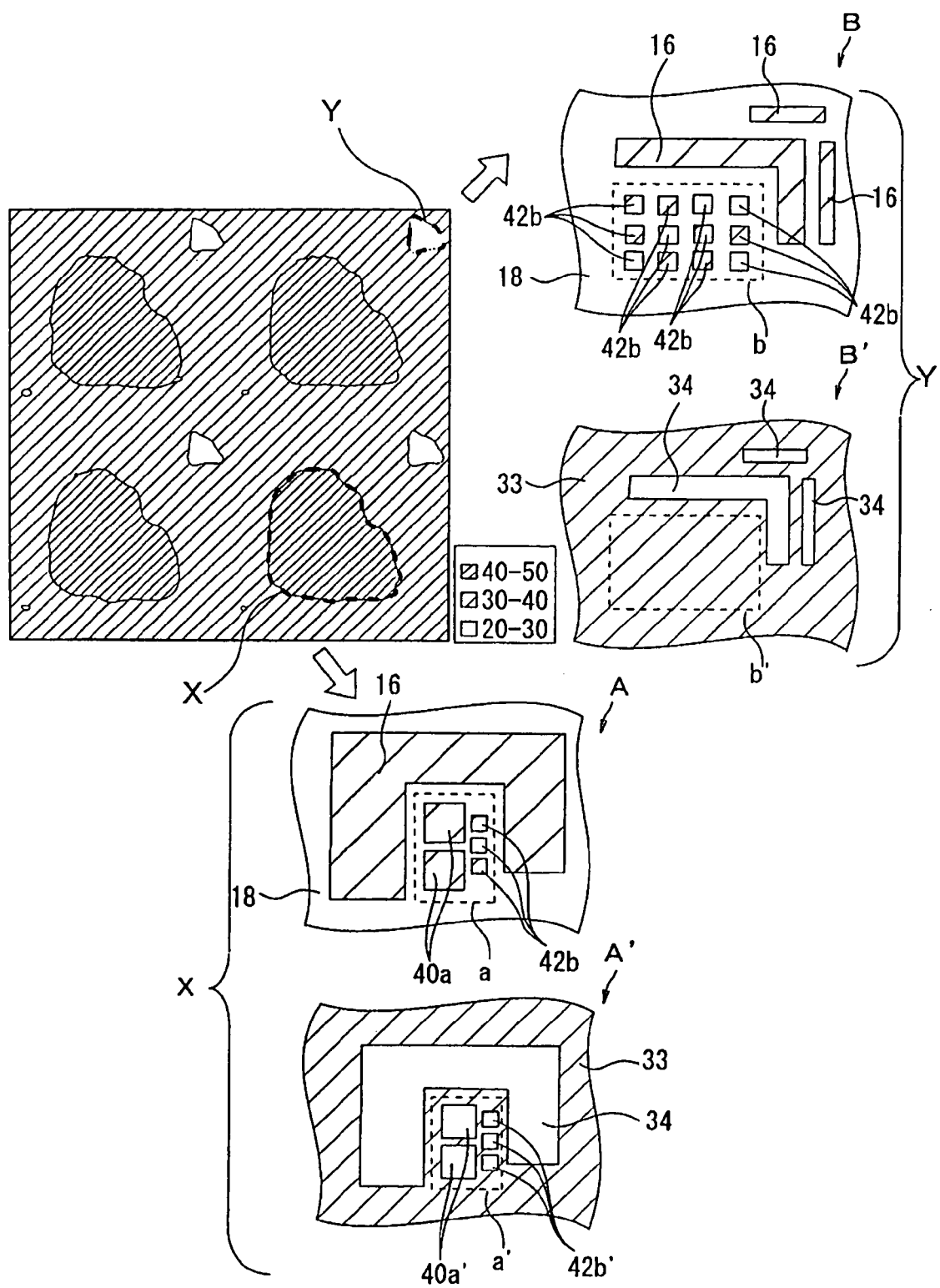
FIG. 16 is a chip diagram useful for explanation of the third embodiment of the invention.

The third embodiment will now be described with reference to FIG. 16 that shows how to abstract areas of patterning and insulation film removing masks on the basis of the CMP pattern ratio. This embodiment is different from the second one mainly in that correction of the insulation film removing mask is made so as to further increase the polishing rate on an area corresponding to the region X where the CMP pattern ratio is higher than the first threshold. In the second embodiment, the patterning mask correction is made so as to provide the second dummy mask pattern 42b in the space region a in consideration of the excessive reduction in the remaining film thickness in the region A.

However, there is an occasion where the reduction in the remaining film thickness in the area corresponding to the region X by means of only the first dummy mask pattern is not satisfactory. Thus, in this embodiment, correction of the insulation film removing mask is made so as to further increase the polishing rate in the region X where the patterning mask is corrected in the same manner as in the second embodiment.

First of all, the STI process is made after an actual patterning mask corrected in the same manner as in the second embodiment is formed.

Then, upon correction of the insulation film removing mask, an insulation film removing mask pattern or transparent pattern 42b' for removing a predetermined area of the insulation film on the second dummy active region formed on the semiconductor substrate corresponding to the region X on the space area a' outside the insulation film removing mask pattern 34 within the first region A' of the insulation film removing mask that corresponds to the region X is correction-designed. See FIG. 16. The correction designing of the transparent pattern 42b' is made in the same manner as the second dummy mask pattern 42b in the second embodiment.

Based on the designed insulation film removing mask or transparent pattern 42b', an actual insulation film removing mask is correction-formed. By using the corrected actual insulation film removing mask the insulation removing process is made to remove the insulation film on the second dummy active region formed on the semiconductor substrate that corresponds to the region X. Consequently, the polishing rate on the area corresponding to the region X is further increased, which in turn further reduces the unevenness of the polishing rate over the entire chip surface. Thus, the remaining film thickness in the region corresponding to the region X after the CMP process is further reduced (the CMP pattern ratio in the region X is further reduced), thereby improving the global flatness over the entire chip surface.

From the above description it is evident that the insulation film removing mask is corrected so as to make the polishing rate in the region X higher than that of the second embodiment. Consequently, it is possible to make a more reliable semiconductor device where the global step difference is further suppressed.

Fourth Embodiment

Figure 17:
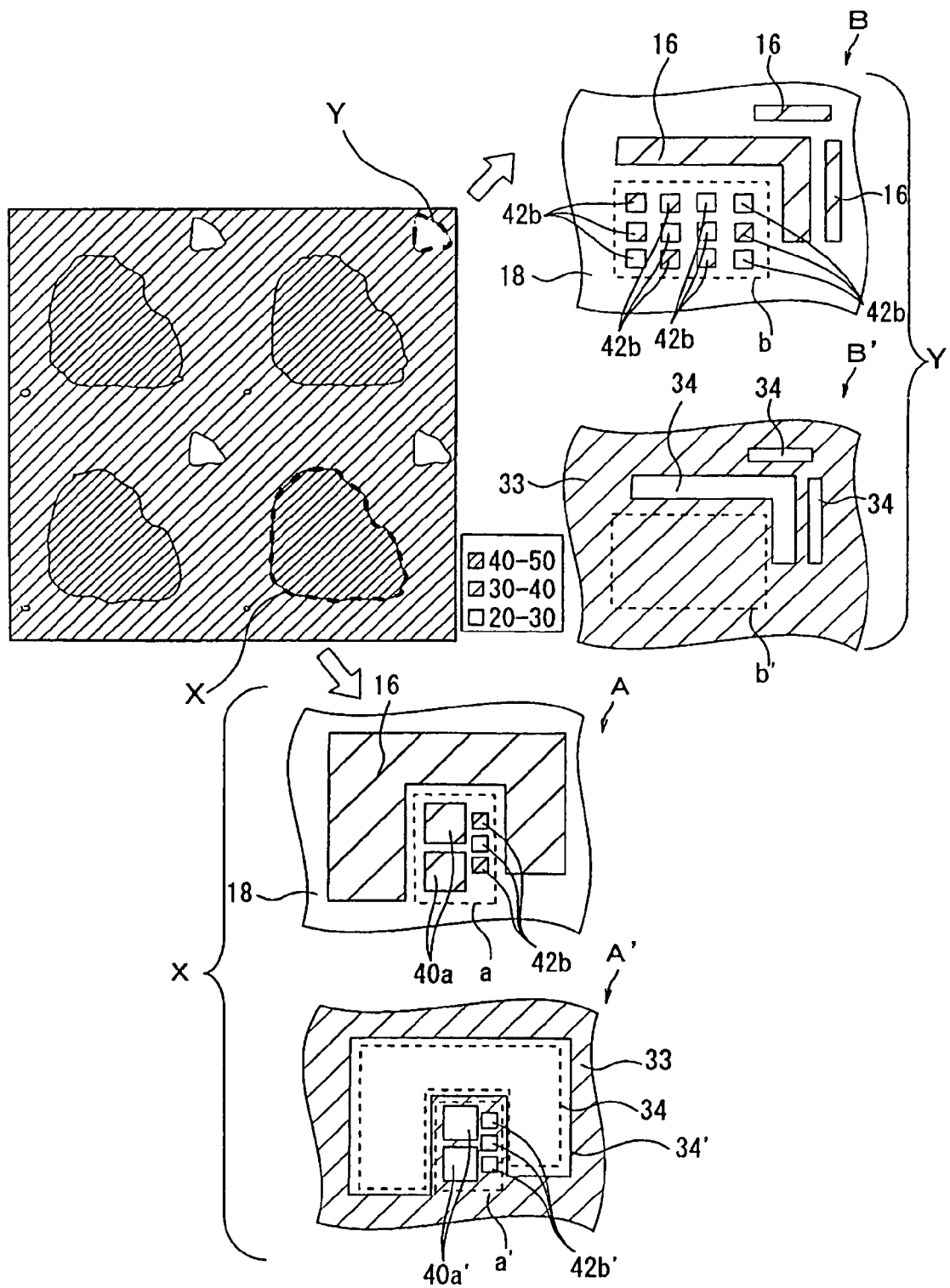
FIG. 17 is a chip diagram useful for explanation of the fourth embodiment of the invention.

The fourth embodiment will now be described with reference to FIG. 17 which shows how to abstract areas of the patterning and insulation film removing masks on the basis of the CMP pattern ratio. This embodiment is different from the third embodiment mainly in that the insulation film removing mask is corrected so as to further increase the polishing rate in an area corresponding to the region X where the CMP patterning ratio is higher than the first threshold. The polishing rate in the area corresponding to the region X is further increase in the third embodiment, but it is necessary to further increase the polishing rate in the area corresponding to the region X depending on the variation of the CMP pattern ratio. Thus, according to the fourth embodiment, the insulation film removing mask is corrected so as to make the polishing rate in the region X higher than that of the third embodiment when the patterning mask is corrected in the same manner as in the third embodiment.

First of all, the STI process is made after the patterning mask corrected in the same manner as in the third embodiment is formed.

Then, upon correction of the insulation film removing mask, the insulation film removing mask or transparent pattern in the first region A' of the insulation film removing mask corresponding to the region X is correction-designed so as to provide an area 34' that is larger than the transparent pattern 34 (surrounded by broken line) in the third embodiment. See FIG. 17. Based on the insulation film removing mask with the transparent pattern 34' corrected, an actual insulation film removing mask is correction-formed. By using the corrected actual insulation film removing mask to perform the insulation film removing process, the insulation film is removed in an area that is larger than the predetermined area on the predetermined rectangular active region formed on the semiconductor substrate that corresponds to the region X.

Consequently, the polishing rate in the area corresponding to the region X in the CMP process is made higher than that of the third embodiment, thereby further improving the unevenness of the polishing rate over the entire chip surface. This further reduces the remaining film thickness in the area corresponding to the region X after the CMP process (the CMP pattern ratio in the region X is further reduced), thus further improving the global flatness over the entire chip surface.

As has been described above, according to the embodiment, the insulation film removing mask is corrected so as to make the polishing rate in the region X higher than that of the third embodiment. As a result, it is possible to make a more reliable semiconductor device where the global step difference is further suppressed.

Fifth Embodiment

Figure 18:
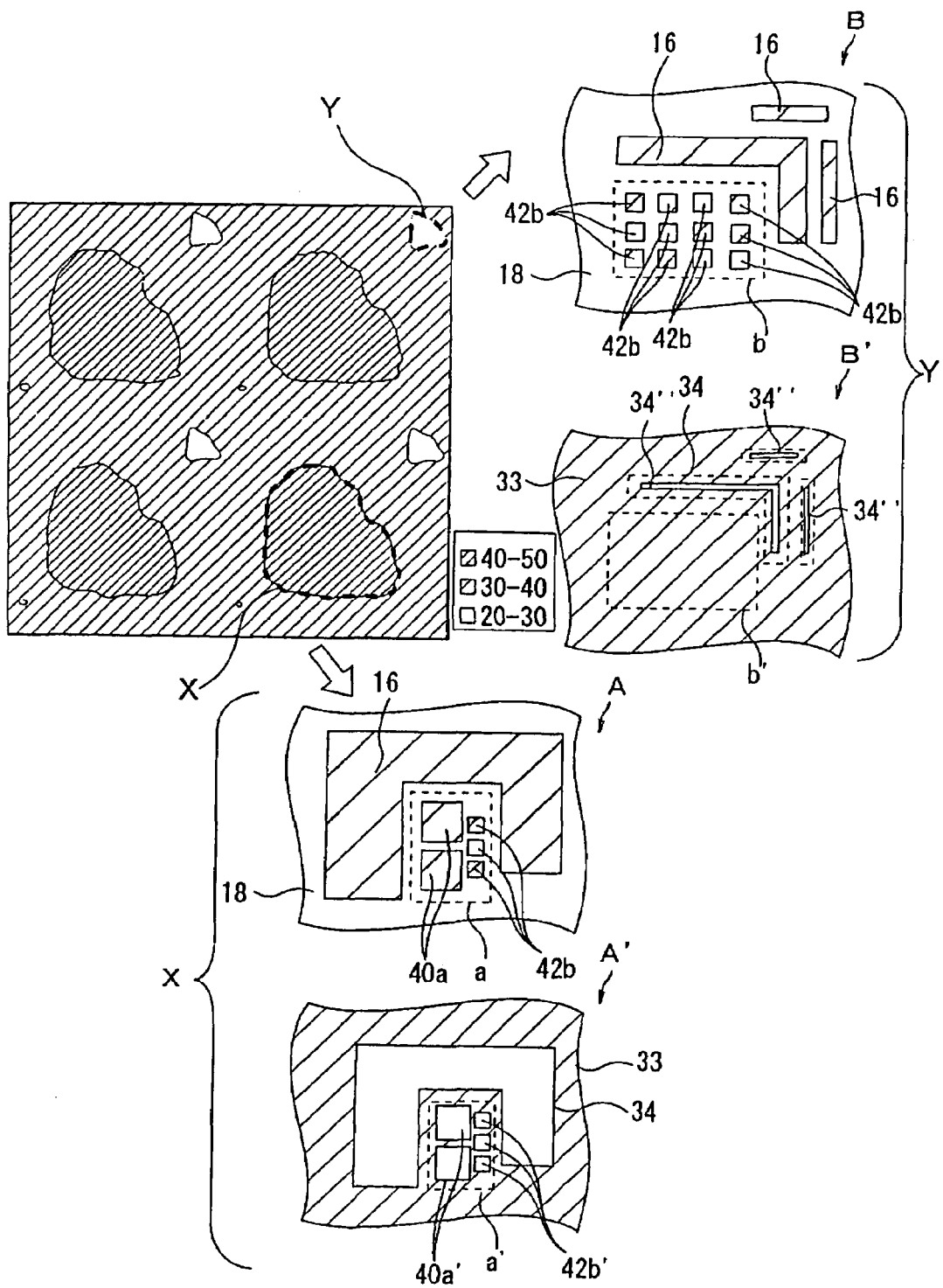
FIG. 18 is a chip diagram useful for explanation of the fifth embodiment of the invention.

The fifth embodiment will now be described with reference to FIG. 18 which shows how to abstract areas of the patterning and insulation film removing masks on the basis of the CMP patterning ration. This embodiment is different from the fourth embodiment mainly in that, instead of increasing the polishing rate in the area corresponding to the region X, the insulation film removing mask is corrected so as to further reduce the polishing rate in an area corresponding to the region Y where the CMP pattern ratio is lower than the second threshold. The polishing rate in the area corresponding to the region X in the fourth embodiment is increased more than that of the third embodiment to improve the global flatness but, in this embodiment, the polishing rate in the area corresponding to the region Y is reduced so as to correct the insulation film removing mask.

First of all, the STI process is performed after the patterning mask corrected in the same manner as in the third embodiment is formed. Then, in order to correct-design the insulation film removing mask, the insulation film removing mask pattern or transparent pattern in the second region B' of the insulation film removing mask corresponding to the region Y is correct-designed such that the area 34" is smaller than the transparent pattern 34 (surrounded by broken line) in the third embodiment. See FIG. 18.

Based on the insulation film removing mask with the transparent pattern 34", an actual insulation film removing mask pattern is correct-formed. By performing the insulation film removing process with the corrected actual insulation film removing mask, the insulation film is removed from an area smaller than the predetermined area on the active region having a width equal to or larger than the predetermined short side length formed on the semiconductor substrate that corresponds to the region Y. Consequently, the polishing rate in the area corresponding to the region Y in the CMP process is made lower than that of the third embodiment, thus improving the unevenness of the polishing rate over the entire chip surface. Accordingly, the remaining film thickness in the area corresponding to the region Y after the CMP process is increased (the CMP pattern ratio in the region Y is increased), thus improving the global flatness over the entire chip surface.

As has been described above, the same effects as those of the fourth embodiment are produced.

Sixth Embodiment

The sixth embodiment will now be described with reference to FIG. 19 which shows evaluation TEG chips A and B having active regions indicated by hatching and the CMP pattern ratio distributions obtained from the patterning masks for forming those chips A and B, and FIGS. 20 and 21 which show how to abstract areas of the insulation film removing masks on the basis of the respective CMP pattern ratios. In each of the above embodiments, in order to improve the global flatness of a certain evaluation TEG chip, an area where the CMP pattern ratio is higher or lower is abstracted to correct the patterning and insulation film removing masks. The CMP pattern ratio obtained from the patterning mask for forming the evaluation TEG chip varies widely with the evaluation TEG chips where the density of active regions varies widely.

Figure 19:
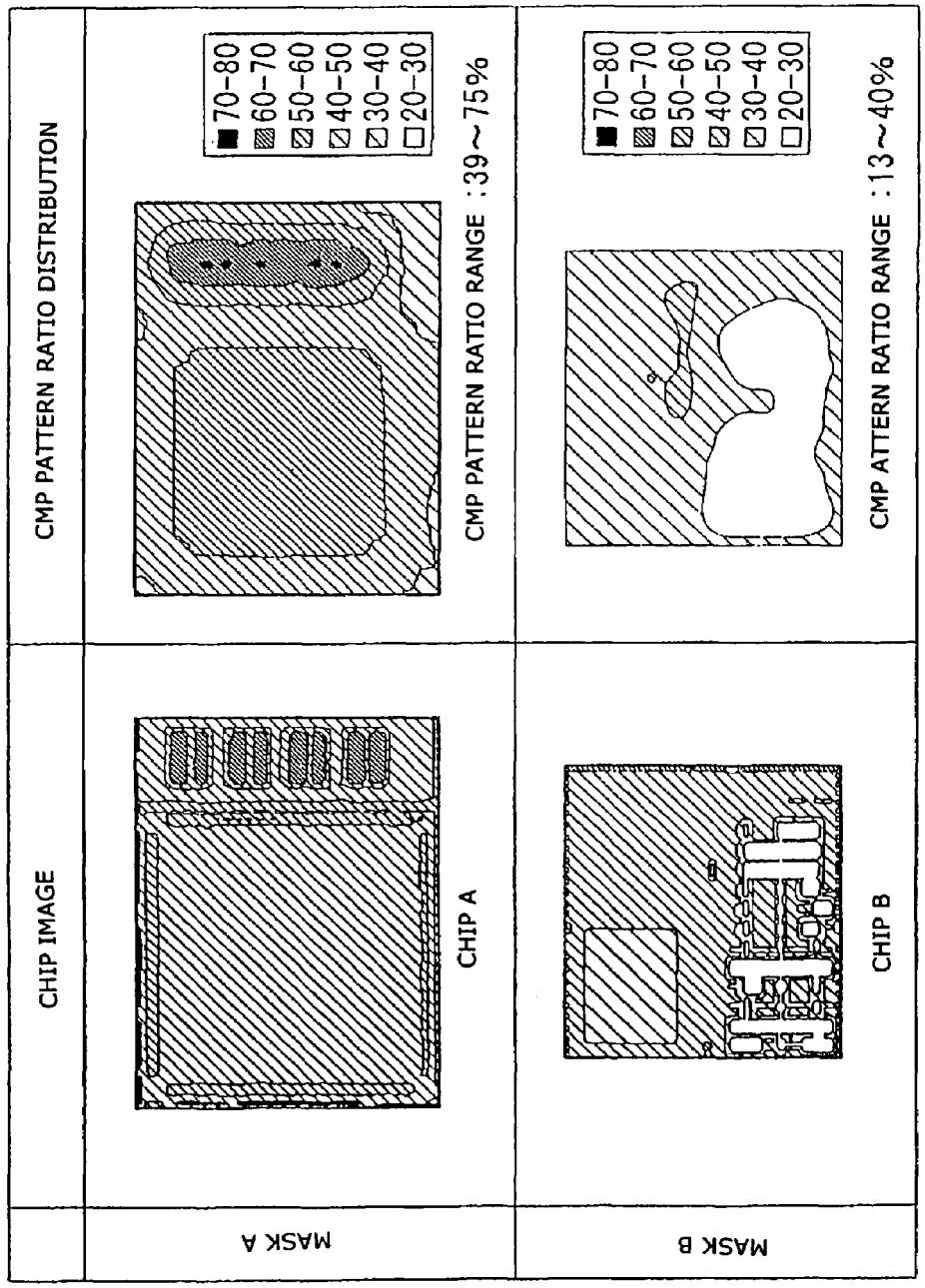
FIGS. 19–21 are chip diagrams useful for explanation of the sixth embodiment of the invention.

For example, as shown in FIG. 19, the CMP pattern ratio rage in the CMP pattern distribution of the chip A obtained from the patterning mask A for forming the evaluation TEG chip A is 39–75%. On the other hand, the CMP pattern ratio range in the CMP pattern ratio distribution of the chip B obtained from the patterning mask B for forming the evaluation TEG chip B is 13–40%. The dense hatching indicates the high concentration of active regions. Using the patterning and insulation film removing masks in each of the above embodiments to form the chips A and B whose CMP pattern ratio ranges are very different, the global flatness is improved for each chip.

However, the range of the remaining film thickness are sometimes different and, therefore, no standard for managing the remaining film thickness cannot be used for the chips A and B having different patterning. Thus, descriptions on not only correction of the patterning and insulation film removing masks such that the global flatness of evaluation TEG chips A and B is improved and the CMP pattern ratio range is substantially the same for each chip (for example, 30–40%, which is called "Standard CMP pattern ratio") but also production of a semiconductor device by using the corrected patterning and insulation film removing masks.

First of all, the STI process is made after each of the patterning masks A and B is formed. The standard CMP pattern ratio is stored in advance through the input device 114. Then, the insulation film removing masks A and B for use in the production of chips A and B are corrected as follows.

Figure 20:
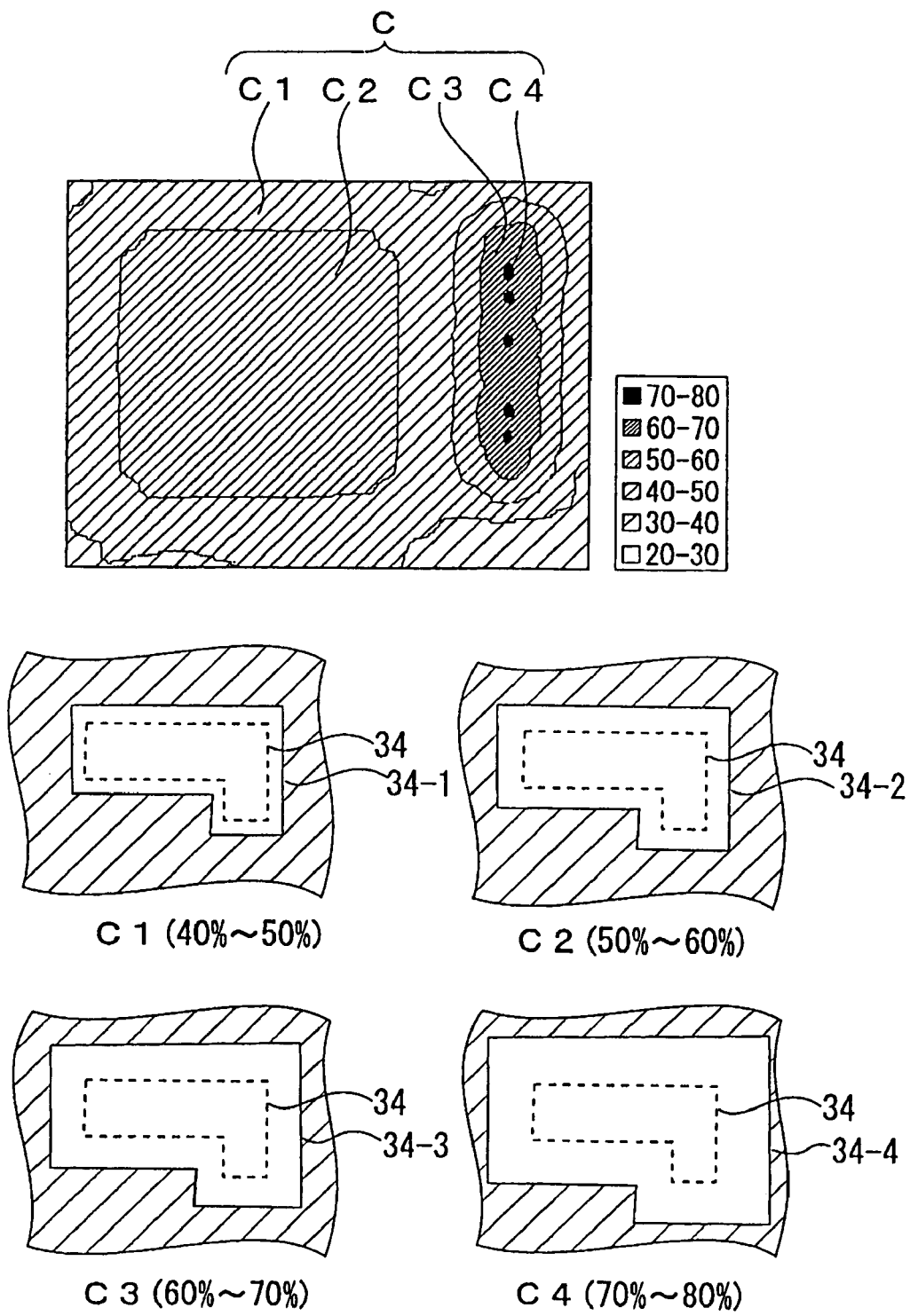

As shown in FIG. 20, to correct the insulation film removing mask, a correction instruction is input into the area abstracting and correcting unit 170 through the input device 114. In response, the CMP pattern ratio about the chip A is read out of the memory 112 to generate the CMP pattern ratio. From the CMP pattern ratio distribution for the chip A (FIG. 19), the third area C within the one-chip mask region that corresponds to an area where the CMP pattern ratio range is outside 30–40% or the CMP pattern ratio is in the range of 40–75%. The third area C is divided into the following four sections depending on the CMP pattern ratio value; i.e., C1(40–50%), C2(50–60%), C3(60–70%), and C4(70–80%).

The range of each of the sections C1–C4 in the third area C is greater than the standard CMP pattern ratio range (30–40%). In such a case, each insulation film removing mask pattern is corrected so as to remove an area larger than a predetermined area within the insulation film on the active region having a width greater than a predetermined short side length within the active region formed on the semiconductor substrate that corresponds to the third region C.

More specifically, the insulation film removing mask pattern is corrected to provide insulation film removing mask patterns or transparent patterns 34-1, 34-2, 34-3 and 34-4 according to the CMP pattern ratio that corresponds to the third region C (C1, C2, C3, and C4). That is, in the active region having a predetermined short side width corresponding to an area having the CMP pattern ratio higher than the standard CMP pattern ratio, the insulation film removing mask pattern is corrected so as to remove the insulation film on an area that is larger than a predetermined area in proportion to an increase of the CMP pattern ratio. The area surrounded by broken line indicates each transparent pattern 34 before correction. The insulation film removing pattern corresponding to each of the CMP pattern ratios C1–C4 is shown in the same shape, various insulation film removing mask patterns may be used. The size of each insulation film removing mask is set by reading from the memory the size of an insulation film removing mask that is determined by the CMP pattern ratio and stored in the computer in advance.

Figure 21:
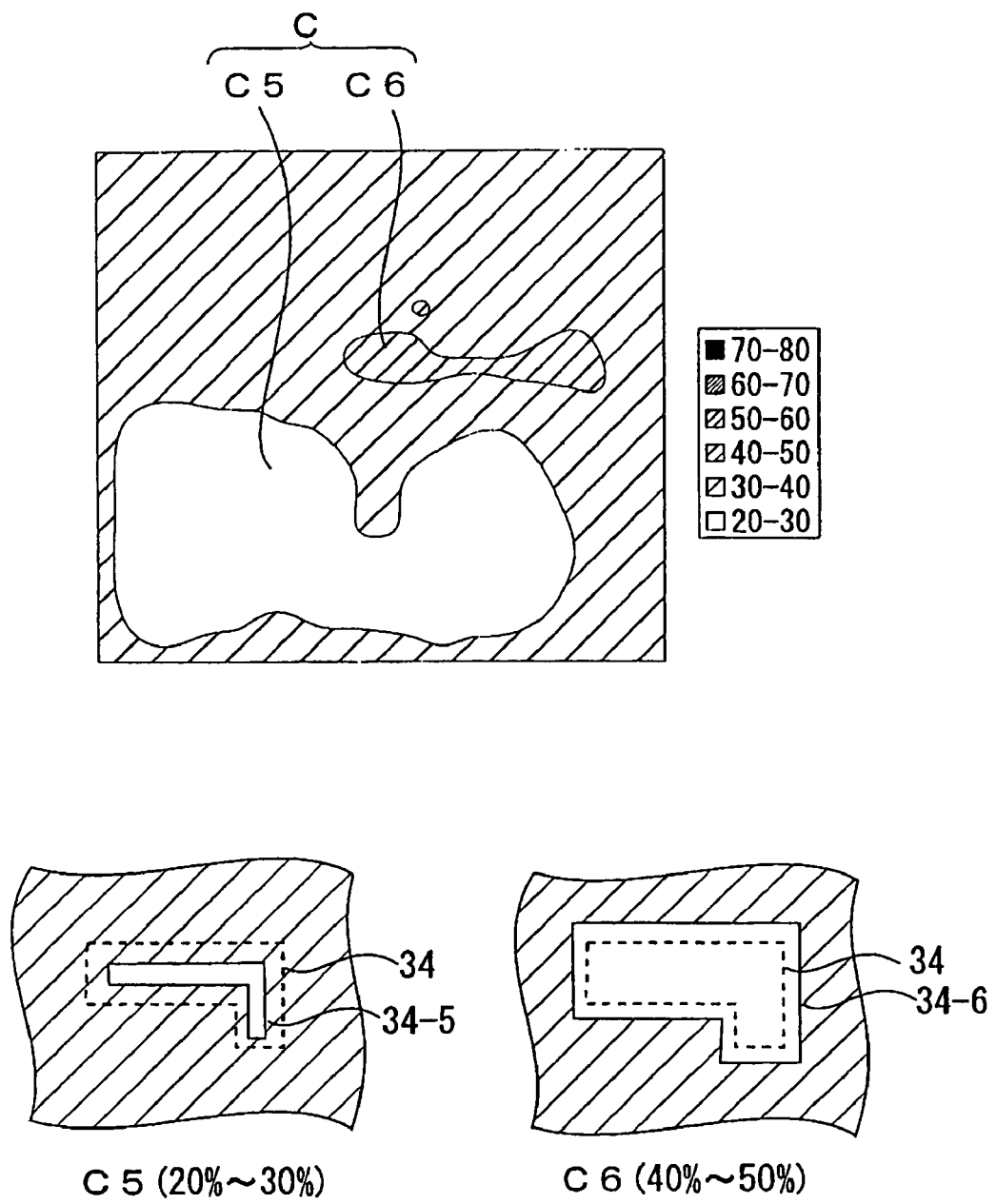

Similarly, as shown in FIG. 21, to correct the insulation film removing mask B, first of all, a third area C within the one-chip mask region where the CMP pattern ratio range is outside 30–40% or the CMP pattern ratio falls in the ranges 13–30% and 40–50% is abstracted on the basis of the CMP pattern ratio distribution about the chip B (FIG. 19). The third area C is divided into two sections C5(20–30%) and C6(40–50%) depending on the CMP pattern ratio value. The CMP pattern ratio range C5(20–30%) is smaller than the standard CMP pattern ratio range (30–40%) but larger than the range C6(40–50%).

In such a case, too, the insulation film removing mask pattern is corrected so as to remove the insulation film in areas larger and smaller than a predetermined area in the active region having a width larger than a predetermined width within the active region formed on the semiconductor substrate that corresponds to the third region C. More specifically, the insulation film removing mask pattern is corrected so as to provide an insulation film removing mask pattern or transparent pattern 34-5 and 34-6 depending on the CMP pattern ratio corresponding to the third region C (C5 and C6). The area surrounded by broken line indicates each insulation film removing mask pattern 34 prior to correction.

That is, the insulation film removing mask pattern is corrected so as to remove an area smaller than the predetermined area in proportion to decrease in the CMP pattern ratio in the active region having a predetermined short side width that corresponds to a region having the CMP pattern ratio lower than the standard CMP pattern ratio. Then, based on such correction, an actual insulation film removing mask is corrected. By using the corrected actual insulation removing masks A and B, each insulation film removing process is performed. In the active region having a width no less than the predetermined short side width formed on the semiconductor substrate that corresponds to the third region on the side of chip A, the area larger than the predetermined region is removed according to the CMP pattern ratio. On the side of chip B, areas smaller and larger than the predetermined region are removed according to the CMP pattern ratio from the active region having a short side width no less than the predetermined length formed on the semiconductor substrate that corresponds to the third region.

Thus, the unevenness of polishing rate on the entire surface of chips A and B is improved in the CMP process, which in turn improves the global flatness of chips A and B after the CMP process. In addition, the remaining film thickness range after the CMP process of each chip is substantially the same as that of the active region formed on the semiconductor substrate that corresponds to the standard CMP pattern ratio range (30–40%). As a result, it is possible to make chips A and B having different patterning such that their remaining film thickness ranges are substantially equal.

As has been described above, not only the global flatness of each chip surface is improved by making use of the CMP pattern ratio distribution but also the insulation film removing mask is corrected such that the remaining film thickness range is substantially equal for each chip. Consequently, the product yield is managed with a common remaining film thickness managing value among chips, thereby improving the efficiency. In this embodiment, the size of insulation film removing mask patterning corresponding to the active region having a width no less than a predetermined value is corrected but, where the first dummy mask pattern is provided in such embodiments as the first through fifth embodiments, the size of the first dummy mask pattern may be corrected in the same manner as in this embodiment.

Seventh Embodiment

The seventh embodiment will now be described with reference to FIG. 22, which shows how to abstract an area from the insulation film removing mask on the base of the CMP pattern ratio. This embodiment is different from the sixth embodiment mainly in that the information about an area of the insulation film on the active region that is to be removed by the insulation film removing process is drawn on the insulation film removing pattern so as to be seen from outside. In the sixth embodiment, the ratio of the insulation film on the active region to be removed with the insulation film removing mask pattern or transparent pattern is corrected according to the CMP pattern ratio in the region where the insulation film removing mask pattern is provided. Where a plurality of insulation film removing mask patterns having different ratios of the insulation film removing region are provided in the one-chip mask region, it is difficult to check the sizing quantity for each of the insulation film removing mask patterns. Thus, according to this embodiment, the insulation film removing mask is corrected so as to identify from outside the information for the area to be removed by the insulation film removing process from the insulation film on the active region having a width no less than a predetermined short side width.

Figure 22:
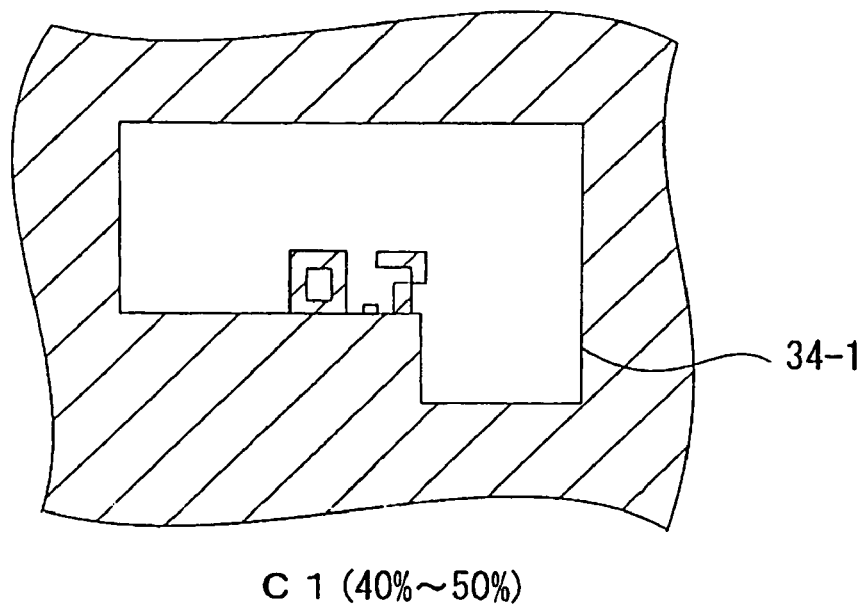
FIG. 22 is a chip diagram useful for explanation of the seventh embodiment of the invention.

Specifically, where the insulation film on the active region corresponding to the insulation film removing mask pattern 34-1 is removed in the insulation film removing process by an area reduced by 0.7 um inwardly from the edge of the top area of the active region, the insulation film removing mask is corrected so as to leave the insulation film on such a letter as "0.7" on the active region (FIG. 22). The information about the area to be removed is either stored in the memory in advance or input to the area abstracting and correcting unit 170 through the input device 114 as needed. According to this embodiment, it is possible to check the information about the insulation film region removed in the insulation film removing process, thus improving the production management efficiency.

Eighth Embodiment

The eighth embodiment will now be described with reference to FIG. 23, which shows how to abstract an area for the patterning mask on the basis of the CMP pattern ratio. That is, description will be made on how to correct the patterning and insulation film removing masks by using the remaining film thickness distribution and how to make a semiconductor device by using the corrected patterning and insulation film removing masks. This embodiment is different from the seventh embodiment mainly in that the patterning mask is corrected so as to identify from outside the information about the area to be removed by the insulation film removing process within the insulation film on the active region having a width no less than a predetermined short side width.

In the seventh embodiment, the information about the insulation film area on the active region to be removed by the insulation film removing process is left as characters or numbers of the insulation film on the active region. The numbers of the insulation film on the active region, however, are removed by the CMP process so that it is impossible to make double-check after the CMP process. Thus, according to this embodiment, the patterning mask is corrected so as to form as the third dummy active region the information about the area to be removed by the insulation film removing process from the insulation film on the active region having a width no less than a predetermined width.

Figure 23:
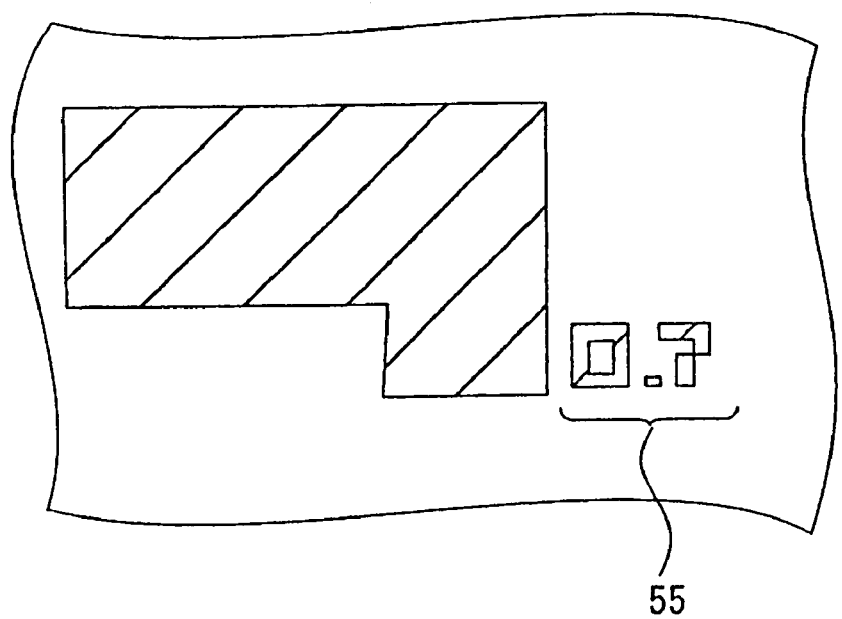
FIG. 23 is a chip diagram useful for explanation of the eighth embodiment of the invention.

Specifically, where the insulation film, which is formed on the active region corresponding to the insulation film removing mask pattern 34-1, is removed from the top area of the active region by an area reduced by 0.7 um inwardly from the edge of the top area, the third dummy mask pattern 55 is corrected as a patterning mask so as to form numbers "0.7" on the semiconductor substrate as the third dummy active region (FIG. 23). According to this embodiment it is possible to check the information about the insulation film area to be removed in the insulation film removing process even after the CMP process, thus improving the production management efficiency.

The present invention is not limited to the above embodiments or combinations thereof and, therefore, may be practiced by using an appropriate condition in a given appropriate process. For example, the patterning and insulation film removing masks may be either positive or negative photo masks. In the above embodiments, each process is started by the instruction input through the input device 114, but the subsequent process may be started automatically in response to the end of the previous process. The predetermined width is defined as the short side width of a rectangular but may be defined as a given appropriate value according to the purpose or design.

As has been described above, according to the invention, it is possible to correct the patterning and insulation film removing masks on the basis of degree of global step difference that is estimated by the CMP pattern ratio distribution. By performing the STI-CMP process with thus corrected patterning and insulation film removing masks, it is possible to suppress the global step difference and provide a reliable semiconductor device.

The invention claimed is:

1. A method of correcting a patterning mask for forming an active region having a first width and an insulation film removing mask for removing an insulation film in a first area, comprising the steps of:
   estimating a thickness of a surface protective film according to a shape of the active region and a material of the surface protective film;
   determining a first threshold according to the patterning mask;
   defining a first region within said patterning mask such that the thickness is greater than the first threshold in the first region;
   providing a first dummy mask pattern outside the patterning mask for forming a first dummy active region having a second width no less than the first width on a semiconductor substrate within said first region to correct said patterning mask; and
   providing an insulation film removing mask pattern for removing said insulation film formed in the first area on said first dummy active region to correct said insulation film removing mask.

2. The method of claim 1, which further comprises, in order to correct said patterning mask, the steps of:
   defining a second region within said patterning mask such that the thickness is smaller than a second threshold smaller than said first threshold in the second region; and
   providing a second dummy mask pattern outside said active region forming mask pattern for forming a second dummy active region having a third width smaller than said first width on said semiconductor substrate in said second region.

3. The method of claim 1, which further comprises the steps of:
   providing a second dummy mask pattern for forming a second dummy active region having a third width smaller than said first width on said semiconductor substrate within said first region in order to correct said patterning mask; and
   providing the insulation film removing mask pattern for removing said insulation film formed in the first area on said second dummy active region in order to correct said insulation film removing mask.

4. A method of correcting a patterning mask for forming an active region having various widths including a first width and an insulation film removing mask for removing an insulation film in a first area, comprising the steps of:
   estimating a thickness of a surface protective film according to a shape of the active region and a material of the surface protective film;
   determining a first threshold according to the patterning mask;
   defining a first region within said patterning mask such that the thickness is greater than the first threshold in the first region; and
   setting an insulation film removing mask pattern so as to remove the insulation film in a second area larger than the first area in a part of said active region having a second width no less than the first width within said active region formed on a semiconductor substrate corresponding to said first region.

5. A method of correcting a patterning mask for forming an active region having various widths including a first width and an insulation film removing mask for removing an insulation film in a first area, comprising the steps of:
   estimating a thickness of a surface protective film according to a shape of the active region and a material of the surface protective film;
   determining a first threshold according to the patterning mask;
   defining a second region within said patterning mask such that the thickness is smaller than the first threshold in the second region; and
   setting an insulation film removing mask pattern so as to remove the insulation film in a second area smaller than the first area in a part of said active region having a second width no less than the first width within said active region formed on a semiconductor substrate corresponding to said second region.

6. A method of correcting a patterning mask for forming an active region having various widths including a first width and an insulation film removing mask for removing an insulation film in a first area, comprising the step of:
   estimating a thickness of a surface protective film according to a shape of the active region and a material of the surface protective film;
   determining a thickness range according to the patterning mask;
   defining a third region within said patterning mask such that the thickness is outside the thickness range;
   wherein when the thickness in said third region is greater than said thickness range, said insulation film removing mask pattern is set so as to remove the insulation film in a second area that is larger than said first area in a part of said active region having a second width no less than the first width within said active region formed on a semiconductor substrate corresponding to said third region;

and when said thickness in said third region is smaller than said thickness range, said insulation film removing mask pattern is set so as to remove the insulation film in a third area that is smaller than said first area in the part of said active region having the second width no less than said first width within said active region formed on said semiconductor substrate corresponding to said third region.

7. The method of claim 6, which further comprises, the step of drawing a mark in said insulation film removing mask to indicate information of the insulation film in the part of said active region.

8. The method of claim 6, which further comprises, the step of providing a third dummy mask pattern for forming a third dummy action region so as to draw a mark in the patterning mask to indicate information of said insulation film in the part of said active region.

* * * * *